(12) United States Patent
Iijima et al.

(10) Patent No.: US 8,121,723 B2
(45) Date of Patent: Feb. 21, 2012

(54) SUBSTRATE TRANSFER SYSTEM, SUBSTRATE TRANSFER APPARATUS AND STORAGE MEDIUM

(75) Inventors: Toshihiko Iijima, Nirasaki (JP); Shinya Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1082 days.

(21) Appl. No.: 11/524,280

(22) Filed: Sep. 21, 2006

(65) Prior Publication Data
US 2007/0062446 A1 Mar. 22, 2007

(30) Foreign Application Priority Data
Sep. 22, 2005 (JP) ................................. 2005-276441

(51) Int. Cl.
*G06F 7/00* (2006.01)
(52) U.S. Cl. ........................................................ 700/218
(58) Field of Classification Search .................. 700/213, 700/214, 218
See application file for complete search history.

(56) References Cited

U.S. PATENT DOCUMENTS

| | | | |
|---|---|---|---|
| 2002/0134179 A1* | 9/2002 | Maruyama et al. | 73/865.8 |
| 2004/0158347 A1* | 8/2004 | Sha et al. | 700/218 |
| 2004/0234362 A1 | 11/2004 | Iijima et al. | |
| 2004/0240971 A1* | 12/2004 | Tezuka et al. | 414/217 |

FOREIGN PATENT DOCUMENTS

| | | |
|---|---|---|
| JP | 2931820 | 5/1999 |
| JP | 2003-197711 | 7/2003 |
| JP | 2003-243474 | 8/2003 |

OTHER PUBLICATIONS

Japanese Office Action dated Jun. 21, 2010 and its English translation of the pertinent portions of the references discussed therein.

* cited by examiner

*Primary Examiner* — Ramya Burgess
(74) *Attorney, Agent, or Firm* — Oblon, Spivak, McClelland, Maier & Neustadt, L.L.P.

(57) ABSTRACT

A substrate transfer system includes a substrate storing apparatus for storing therein one or more substrates; at least one substrate processing apparatus for performing a predetermined processing on the substrate; and a substrate transfer apparatus for transferring the substrate by moving between the substrate storing apparatus and the substrate processing apparatus, the substrate transfer apparatus including at least one substrate transfer unit for supporting the substrate, unloading the substrate from the substrate storing apparatus or the substrate processing apparatus, and loading the substrate into the substrate storing apparatus of the substrate processing apparatus. The substrate transfer apparatus moves while supporting the substrate by the substrate transfer unit.

17 Claims, 10 Drawing Sheets

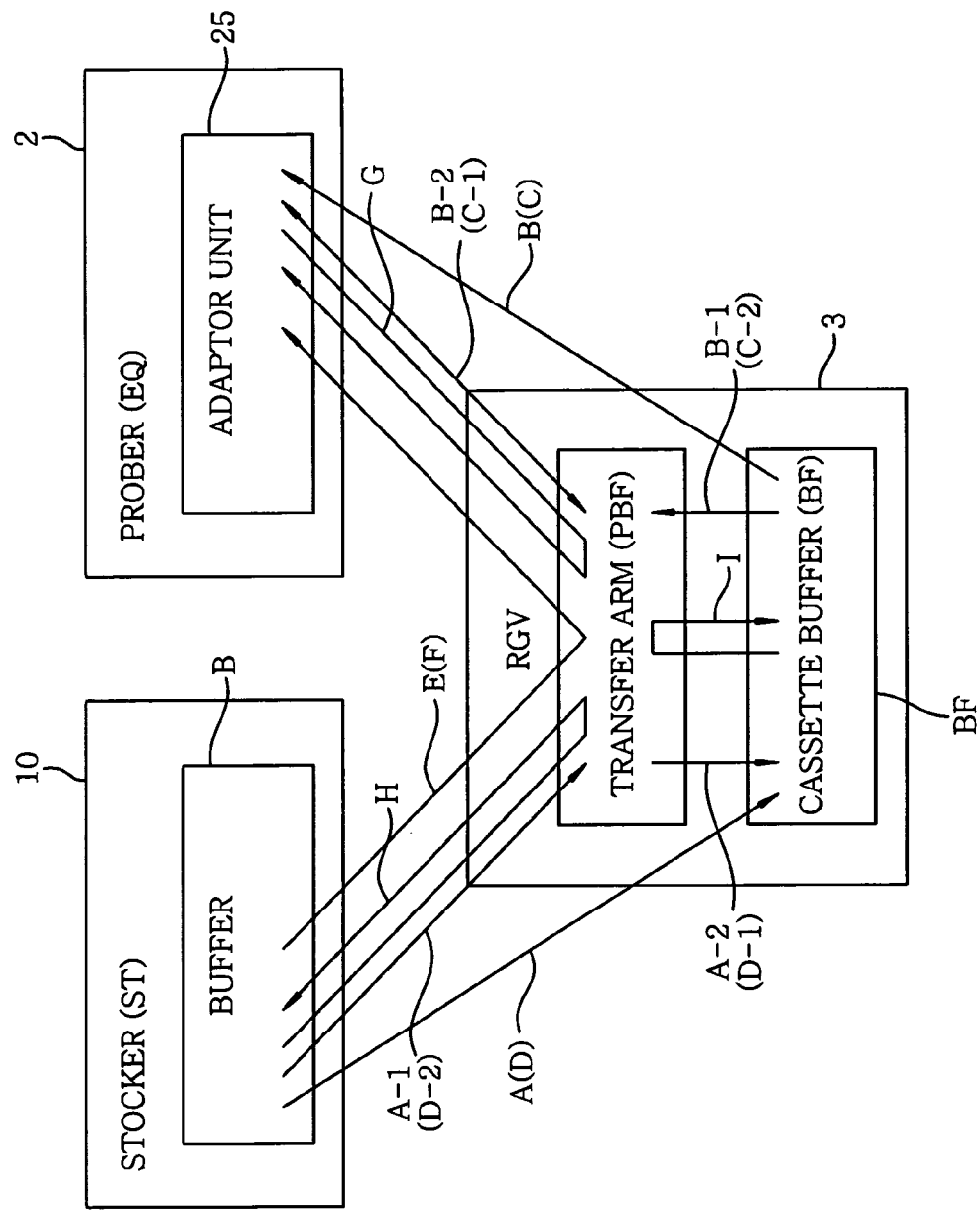

SUBSTRATE TRANSFER SYSTEM, SUBSTRATE TRANSFER APPARATUS AND STORAGE MEDIUM

FIELD OF THE INVENTION

The present invention relates to a substrate transfer system, a substrate transfer apparatus and a storage medium for storing a program of executing a substrate transfer method; and, more particularly, to a substrate transfer system for transferring substrates sheet by sheet.

BACKGROUND OF THE INVENTION

A substrate transfer system, as a substrate processing system for performing a process of multiple steps on a wafer as a substrate, includes a stocker for stocking therein unprocessed/processed wafers; a plurality of substrate processing apparatuses corresponding to the respective steps; and an RGV (Rail Guided Vehicle) as a substrate transfer vehicle for transferring the wafers between the stocker and each of the substrate processing apparatuses.

Conventionally, a wafer has a small diameter and, therefore, it is taken a short period of time to perform each of the steps for a single wafer. Thus, in view of improving transfer efficiency, the RGV transfers a carrier accommodating therein a plurality of wafers, e.g., 25 wafers, between the stocker and each of the substrate processing apparatuses and loads the corresponding carrier into each of the substrate processing apparatuses.

A recent trend of large diameter wafers has increased the time required for performing the respective steps on the wafer. Accordingly, a substrate transfer system for loading wafers sheet by sheet into each of the substrate processing apparatuses (hereinafter, referred to as 'single wafer transfer system') is being widely used. An RGV in this substrate transfer system receives wafers sheet by sheet from the stocker by using a transfer arm mechanism of the RGV and then transfers the received wafers while accommodating them in a buffer of the RGV (see, e.g., Japanese Patent Laid-open Application No. 2005-93690). Further, the RGV unloads the wafers from the buffer by using the transfer arm mechanism and then loads them sheet by sheet into each of the substrate processing apparatuses.

However, the above-described single wafer transfer system has a drawback in that wafer transfer efficiency is difficult to improve due to a large number of operations for accommodating the wafers in the buffer of the RGV and unloading them therefrom, which requires an extended time period. Moreover, since a recent improvement of a processing technique has shortened the time required for performing the respective steps, the operations for accommodating the wafers in the buffer of the RGV and unloading them therefrom bottleneck the improvement of the wafer transfer efficiency in the single wafer transferring system.

SUMMARY OF THE INVENTION

It is, therefore, an object of the present invention to provide a substrate transfer system, a substrate transfer apparatus and a storage medium for storing a program of executing a substrate transfer method, which are capable of improving the wafer transfer efficiency.

In accordance with an aspect of the present invention, there is provided a substrate transfer system, which includes:

a substrate storing apparatus for storing therein one or more substrates;

at least one substrate processing apparatus for performing a predetermined processing on the substrate; and a substrate transfer apparatus for transferring the substrate by moving between the substrate storing apparatus and the substrate processing apparatus, the substrate transfer apparatus including at least one substrate transfer unit for supporting the substrate, unloading the substrate from the substrate storing apparatus or the substrate processing apparatus, and loading the substrate into the substrate storing apparatus of the substrate processing apparatus, wherein the substrate transfer apparatus moves while supporting the substrate by the substrate transfer unit.

In accordance with the substrate transfer system, since the substrate transfer apparatus moves while supporting the substrate by the substrate transfer unit, the substrate does not need to be accommodated in and/or unloaded from the buffer of the substrate transfer apparatus, which leads to the improvement of the transfer efficiency.

Preferably, the substrate transfer apparatus includes with a plurality of the substrate transfer units, and at least one of the substrate transfer units supports a plurality of the substrates.

In accordance with the substrate transfer system, the substrate transfer apparatus includes a plurality of the substrate transfer units and, also, at least one of the substrate transfer units supports a plurality of the substrates, so that the substrate transfer apparatus can move while supporting the substrates by the substrate transfer unit. Hence, the substrate transfer efficiency can be further improved.

Preferably, the substrate transfer unit is a transfer arm for mounting thereon the substrate.

In accordance with the substrate transfer system, the substrate transfer apparatus moves between a plurality of substrate processing apparatuses, so that the efficiency of transferring the substrates between the substrate processing apparatuses can be improved.

Preferably, the substrate transfer system includes a plurality of the substrate processing apparatuses, and the substrate transfer apparatus moves between the substrate processing apparatuses.

In accordance with the substrate transfer system, the substrate transfer apparatus moves between a plurality of substrate processing apparatuses, so that the efficiency of transferring the substrates between the substrate processing apparatuses can be improved.

Preferably, there is set an operation stopping position at which the substrate transfer unit stops its operation while supporting the substrate, in the substrate transfer system.

In accordance with the substrate transfer system, since there is provided an operation stopping position at which the substrate transfer unit stops its operation while supporting the substrate, the substrate transfer apparatus can move while supporting the substrate by the substrate transfer unit and thus the substrate does not need to be accommodated in and unloaded from the buffer. As a result, the substrate transfer efficiency can be improved.

Preferably, the substrate transfer apparatus has a plurality of the substrate transfer units, and at least one of the substrate transfer units stops its operation at the operation stopping position.

In accordance with the substrate transfer system, the substrate transfer apparatus has a plurality of substrate transfer units and, also, at least one of the substrate transfer units stops its operation at the operation stopping position. Accordingly, a variety of selectable substrate transfer types can be provided. Hence, the substrate transfer efficiency can be further improved.

Preferably, the substrate transfer system further includes a controller for setting a transfer sequence of the substrate by combining a plurality of transfer commands, each for specifying a transfer route of the substrate transferred by the substrate transfer unit, wherein, in the transfer route specified by at least one of the transfer commands, the operation stopping position is set.

In accordance with the substrate transfer system, the controller sets a transfer sequence of the substrate by combining a plurality of transfer commands including those for specifying a transfer route with the operation stopping position where the substrate transfer unit stops its operation while supporting the substrate thereby, so that the substrate transfer apparatus can move while supporting the substrate by the substrate transfer unit according to the transfer sequence thus set. Accordingly, the substrate does not need to be accommodated in and unloaded from the buffer of the substrate transfer apparatus. As a result, the substrate transfer efficiency can be improved.

Preferably, the substrate transfer apparatus has a plurality of the substrate transfer units, and the controller sets the transfer sequence to have the transfer routes of the substrates transferred by each of the substrate transfer units different from each other.

In accordance with the substrate transfer system, the controller sets a transfer sequence to have the transfer routes of the substrates transferred by each of the substrate transfer units different from each other. Accordingly, the flexibility of setting the transfer sequence can be increased and, thus, the substrate transfer efficiency can be further improved.

Preferably, at least one of the substrate transfer units loads the substrates into the substrate storing apparatus or the substrate processing apparatus, and at least one of the other substrate transfer units unloads the substrates therefrom, in the transfer sequence.

In accordance with the substrate transfer system, at least one of the substrate transfer units loads the substrates into the substrate storing apparatus or the substrate processing apparatus, and then, at least one of the other substrate transfer units unloads the substrates from the substrate storing apparatus or the substrate processing apparatus in the transfer sequence. Therefore, a rapid delivery of the substrates can be carried out, thereby further improving the substrate transfer efficiency.

Preferably, the substrate transfer apparatus includes a plurality of substrate transfer units, and the controller sets the transfer sequence to have the substrates be transferred consecutively by the substrate transfer units.

In accordance with the substrate transfer system, the controller sets a transfer sequence to have the substrates be transferred consecutively by the plural substrate transfer units, so that the substrates are consecutively transferred. Hence, the substrate transfer efficiency can be further improved.

Preferably, the substrate processing apparatus has a substrate delivery part for delivering a plurality of the substrates, and the substrate transfer unit supports the substrates.

In accordance with the substrate transfer system, the substrate processing apparatus has a plurality of substrate delivery parts for delivering a plurality of substrates, and the substrate transfer unit for loading the substrates into the substrate processing apparatus and unloading them therefrom supports a plurality of substrates. Therefore, the substrate transfer unit can deliver a plurality of substrates to the substrate processing apparatus at a time. As a result, the substrate transfer efficiency can be improved.

Preferably, the substrate storing apparatus includes another substrate delivery part for delivering a plurality of the substrates.

In accordance with the substrate transfer system, the substrate storing apparatus has a substrate delivery part for delivering a plurality of substrates. Thus, the substrate transfer unit can deliver a plurality of substrates to the substrate storing apparatus at a time. As a result, the substrate transfer efficiency can be improved.

In accordance with another aspect of the present invention, there is provided a substrate transfer apparatus for transferring one or more substrate by moving between a substrate storing apparatus for storing therein the substrate and at least one substrate processing apparatus for performing a predetermined processing on the substrate, which includes:

at least one substrate transfer unit for supporting the substrate, unloading the substrate from the substrate storing apparatus or the substrate processing apparatus, and loading the substrate into the substrate storing apparatus or the substrate processing apparatus, wherein the substrate transfer apparatus moves while supporting the substrate by the substrate transfer unit.

In accordance with the apparatus, since the substrate transfer apparatus moves while supporting the substrate by the substrate transfer unit, the substrate does not need to be accommodated in and/or unloaded from the buffer of the substrate transfer apparatus, which leads to the improvement of the transfer efficiency.

In accordance with still another aspect of the present invention, there is provided a computer-readable storage medium for storing therein a program for executing on a computer a substrate transfer method in a substrate transfer system including a substrate storing apparatus for storing therein one or more substrates, at least one substrate processing apparatus for performing a predetermined processing on the substrate and a substrate transfer apparatus for transferring the substrate while moving between the substrate storing apparatus and the substrate processing apparatus, the substrate transfer apparatus having at least one substrate transfer unit for supporting the substrate, unloading the substrate from the substrate storing apparatus or the substrate processing apparatus, and loading the substrate into the substrate storing apparatus or the substrate processing apparatus, wherein the program has a moving module for moving the substrate transfer apparatus while supporting the substrate by the substrate transfer unit.

In accordance with the storage medium, since the substrate transfer apparatus moves while supporting the substrate by the substrate transfer unit, the substrate does not need to be accommodated in and/or unloaded from the buffer of the substrate transfer apparatus, which leads to the improvement of the transfer efficiency.

Preferably, the program further has a substrate supporting module for stopping an operation of the substrate transfer unit while the latter supports the substrate.

In accordance with the storage medium, the substrate transfer unit stops its operation while supporting the substrate thereby, so that the substrate transfer apparatus can move while supporting the substrate by the substrate transfer unit. Consequently, the substrate does not need to be accommodated in and unloaded from the buffer of the substrate transfer apparatus, which leads to the improvement of the substrate transfer efficiency.

In accordance with still another aspect of the present invention, there is provided a substrate transfer system, which includes:

a substrate storing apparatus for storing therein one or more substrates;

at least one substrate processing apparatus for performing a predetermined processing on the substrate; and a substrate transfer apparatus for transferring the substrate by moving between the substrate storing apparatus and the substrate processing apparatus, wherein the substrate processing apparatus includes a substrate delivery part for delivering the substrate, the substrate delivery part having a plurality of substrate accommodating units, each for accommodating therein a single substrate, the substrate transfer apparatus includes a plurality of substrate transfer units for supporting the substrate, unloading the substrate from the substrate storing apparatus or the substrate processing apparatus, and loading the substrate into the substrate storing apparatus or the substrate processing apparatus, at least one of the substrate transfer units supporting a plurality of the substrates and at least one of the other substrate transfer units supporting a single substrate, and, among the substrate transfer units, those for delivering the substrates to the substrate delivery part are selected in accordance with the number of the substrate accommodating units having no substrate in the substrate delivery part.

In accordance with the substrate transfer system, a substrate transfer unit for delivering the substrates to the substrate delivery part is selected among the substrate transfer units for supporting a plurality of substrates and the substrate transfer unit for supporting a single substrate in accordance with the number of substrate accommodating units having no substrate in the substrate delivery part. Accordingly, it is possible to match the number of the substrate accommodating units having no substrate with the number of substrates that can be supported by the substrate transfer unit. Consequently, the substrate transfer efficiency can be improved.

Preferably, when only one substrate accommodating unit has no substrate in the substrate delivery part, the substrate transfer unit for supporting a single substrate is selected.

In accordance with the substrate transfer system, when only one substrate accommodating unit has no substrate in the substrate delivery part, the substrate transfer unit for supporting a single substrate is selected. Consequently, it is possible to prevent the substrate transfer unit from failing to deliver substrates to the substrate delivery part.

In accordance with still another aspect of the present invention, there is provided a computer-readable storage medium for storing a program for executing on a computer a substrate transfer method in a substrate transfer system including a substrate storing apparatus for storing therein one or more substrate; at least one substrate processing apparatus for performing a predetermined processing on the substrate; and a substrate transfer apparatus for transferring the substrate by moving between the substrate storing apparatus and the substrate processing apparatus, the substrate processing apparatus having a substrate delivery part for delivering the substrate, the substrate delivery part having a plurality of substrate accommodating units, each for accommodating a single substrate, the substrate transfer apparatus having a plurality of substrate transfer units for supporting the substrates, unloading the substrates from the substrate storing apparatus or the substrate processing apparatus, and loading into the substrate storing apparatus or the substrate processing apparatus, at least one of the substrate transfer units supporting a plurality of the substrates and at least one of the other substrate transfer units supporting a single substrate, wherein the program has a substrate transfer unit selecting module for selecting at least one substrate transfer unit for delivering the substrate to the substrate delivery part among the substrate transfer units in accordance with the number of the substrate accommodating units having no substrate in the substrate delivery part.

In accordance with the storage medium, a substrate transfer unit for delivering the substrates to the substrate delivery part is selected among the substrate transfer units for supporting a plurality of substrates and the substrate transfer unit for supporting a single substrate in accordance with the number of substrate accommodating units having no substrate in the substrate delivery part. Accordingly, it is possible to match the number of the substrate accommodating units having no substrate with the number of substrates that can be supported by the substrate transfer unit. Consequently, the substrate transfer efficiency can be improved.

In accordance with still another aspect of the present invention, there is provided computer-readable storage medium for storing a program for executing on a computer a substrate transfer method in a substrate transfer system including a substrate storing apparatus for storing therein one or more substrate; at least one substrate processing apparatus for performing a predetermined processing on the substrate; a substrate transfer apparatus for transferring the substrate by moving between the substrate storing apparatus and the substrate processing apparatus; and a controller for setting a transfer sequence of the substrates, wherein the program has a state inquiring module in which the controller informs the substrate processing apparatus of specifications of the substrates to be transferred and also inquires a state of the substrate processing apparatus;

a state informing module in which the substrate processing apparatus that has received the inquiry informs the controller of the state thereof;

a transfer sequence setting module in which the controller sets the transfer sequence based on the state of the substrate processing apparatus; and a transfer sequence informing module in which the controller informs the substrate transfer apparatus of the transfer sequence thus set.

In accordance with the storage medium, the controller informs the substrate processing apparatus of specifications of the substrate to be transferred and also inquires about a state of the substrate processing apparatus. The substrate processing apparatus that has received the inquiry informs the controller of its state and, then, the controller sets a transfer sequence based on the received state. Next, the controller informs the substrate transfer apparatus of the transfer sequence thus set. Accordingly, the substrate processing apparatus can be informed of the specifications of the substrate to be transferred in advance and thus does not need to inquire of the controller the specifications of the substrate after the substrates transfer apparatus has moved thereto. When the substrate processing apparatus is not able to receive the substrate, the substrate transfer apparatus can pass by the corresponding substrate processing apparatus. As a result, the substrate transfer efficiency can be improved.

Preferably, the substrate transfer apparatus has at least one substrate transfer unit for supporting the substrate, unloading the substrate from the substrate storing apparatus or the substrate processing apparatus, and loading the substrate into the substrate storing apparatus or the substrate processing apparatus, and wherein the program further has a moving module in which the substrate transfer apparatus moves while supporting the substrate by the substrate transfer unit.

In accordance with the storage medium, the substrate transfer apparatus moves while supporting the substrate by the substrate transfer unit, so that the substrate does not need to be accommodated in and unloaded from the buffer of the substrate transfer apparatus. As a result, the substrate transfer efficiency can be further improved.

Preferably, the substrate processing apparatus has either a substrate delivery part for delivering a plurality of substrates or a substrate delivery part for delivering a single substrate; and wherein the program further has a substrate delivery part type inquiring module in which the substrate transfer apparatus inquires the substrate processing apparatus of a type of the substrate delivery part; and a substrate delivery part type informing module in which the substrate processing apparatus informs the substrate transfer apparatus of the type of the substrate delivery part.

In accordance with the storage medium, the substrate processing apparatus having either a substrate delivery part for delivering a plurality of substrates or a substrate delivery part for delivering a single substrate informs the substrate transfer apparatus of the type of the substrate delivery part. Therefore, it is possible to match the number of substrates delivered at a time to the substrate processing apparatus by the substrate transfer apparatus with the number of substrates that can be received by the substrate processing apparatus. Consequently, the substrates can be accurately delivered.

BRIEF DESCRIPTION OF THE DRAWINGS

The above and other objects and features of the present invention will become apparent from the following description of preferred embodiments, given in conjunction with the accompanying drawings, in which:

FIG. 7 shows transfer routes specified by transfer commands of a single operation mode;

DETAILED DESCRIPTION OF THE PREFERRED EMBODIMENT

Hereinafter, preferred embodiments of the present invention will be described with reference to the accompanying drawings.

Figure 1:
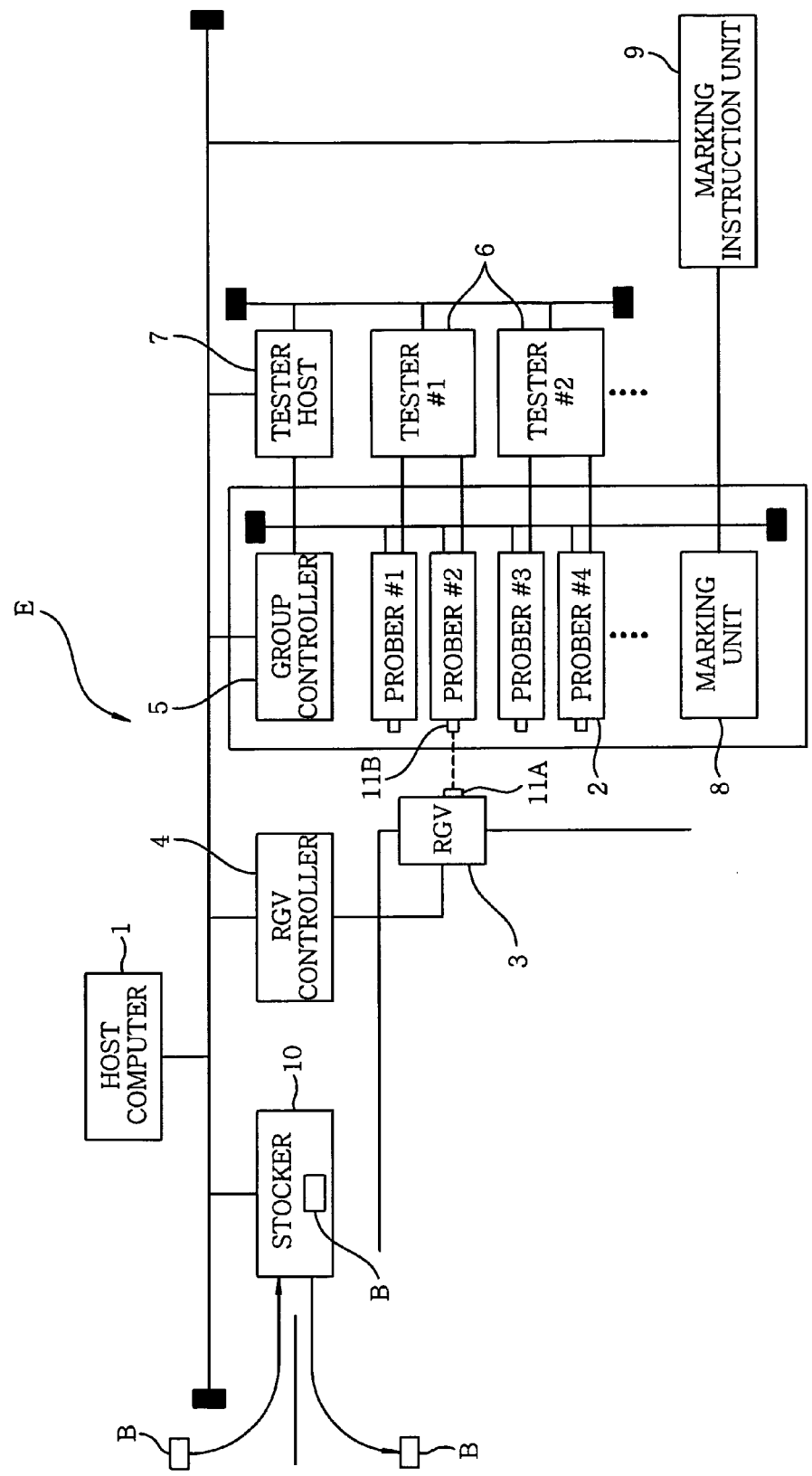
FIG. 1 is a block diagram showing a schematic configuration of a substrate transfer system in accordance with a preferred embodiment of the present invention.

FIG. 1 is a block diagram showing a schematic configuration of a substrate transfer system in accordance with a preferred embodiment of the present invention.

Referring to FIG. 1, a substrate transfer system E includes: a host computer 1 (controller) for managing an entire manufacturing process including a testing process for a wafer as a substrate having thereon a semiconductor device; a plurality of probers 2 (substrate processing apparatuses) as testing apparatuses for testing electrical characteristics of the wafer under the management of the host computer 1; at least one automatic transfer device 3 (substrate transfer apparatuses) (hereinafter, referred to as "RGV") for loading various wafers of different diameters and automatically transferring the wafers to the probers 2 on demand; and a transfer controller 4 (hereinafter, referred to as "RGV controller") for controlling the RGV 3.

The RGV 3 and the probers 2 respectively have optically-coupled parallel I/O (hereinafter, referred to as "PIO") communications interfaces 11A and 11B based on a SEMI standard E23 or E84, wherein the wafers are transferred, e.g., sheet by sheet while carrying out optically-coupled PIO communications therebetween. During the optically-coupled PIO communications, the probers 2 inform the RGV 3 of types of adaptor units to be described later, for example. The probers 2 are configured as single wafer probers 2 to receive and test the wafers sheet by sheet. Hereinafter, the single wafer probers 2 are simply referred as probers 2.

Further, the RGV controller 4 is connected with the host computer 1 via a SECS (Semiconductor Equipment Communications Standard) communications line to control the RGV 3 under the management of the host computer 1 via wireless communications and manage the wafers in a same lot.

In the aforementioned substrate transfer system E, an AGV (Automatic Guided Vehicle), instead of the RGV 3, can be used as an automatic transfer apparatus. Further, the substrate transfer system E may include, e.g., an OHT (Overhead Hoist Transport vehicle) for transferring the wafer along a ceiling path, other than the RGV 3 and the AGV.

The probers 2 are connected with the host computer 1 via a group controller 5 and also the SECS communications line. The host computer 1 manages the probers 2 via the group controller 5.

The group controller 5 manages test information, such has recipe data and log data of the probers 2. Testers 6 are connected with the respective probers 2 via a GPIB communications circuit or a TTL communications circuit, and each of the probers 2 individually carries out a specific test, e.g., a DC test, a burn-in test (stress test) or a pre-laser test, in response to an instruction from the corresponding tester 6. Each of the testers 6 is connected with the host computer 1 via a tester host computer 7 (hereinafter, referred to as "tester host") and also the SECS communications line. The host computer 1 manages the testers 6 via the tester host 7.

A marking unit 8 for performing a specific marking process based on a test of the wafer is connected with the host computer 1 via a marking instruction unit 9, e.g., a PC (Personal Computer). The marking instruction unit 9 instructs the marking unit 8 to perform the marking process based on data managed by the tester host 7.

Further, a stocker 10 for storing therein a plurality of buffers B is connected with the host computer 1 through the SECS communications line. Each of the buffers B accommodates therein a plurality of untested and/or tested wafers and delivers the wafers between itself and the RGV 3, as will be described later. The stocker 10 stores and classifies the untested and/or tested wafers sheet by sheet under the management of the host computer 1 and also delivers the wafers sheet by sheet between itself and the RGV 3 via the buffers B. An operator loads the wafers on a buffer basis by loading the buffers B accommodating therein a plurality of untested wafers into the stocker 10 and unloads the wafers on a buffer basis by unloading the buffers B accommodating therein a plurality of tested wafers from the stocker 10.

Figure 2:
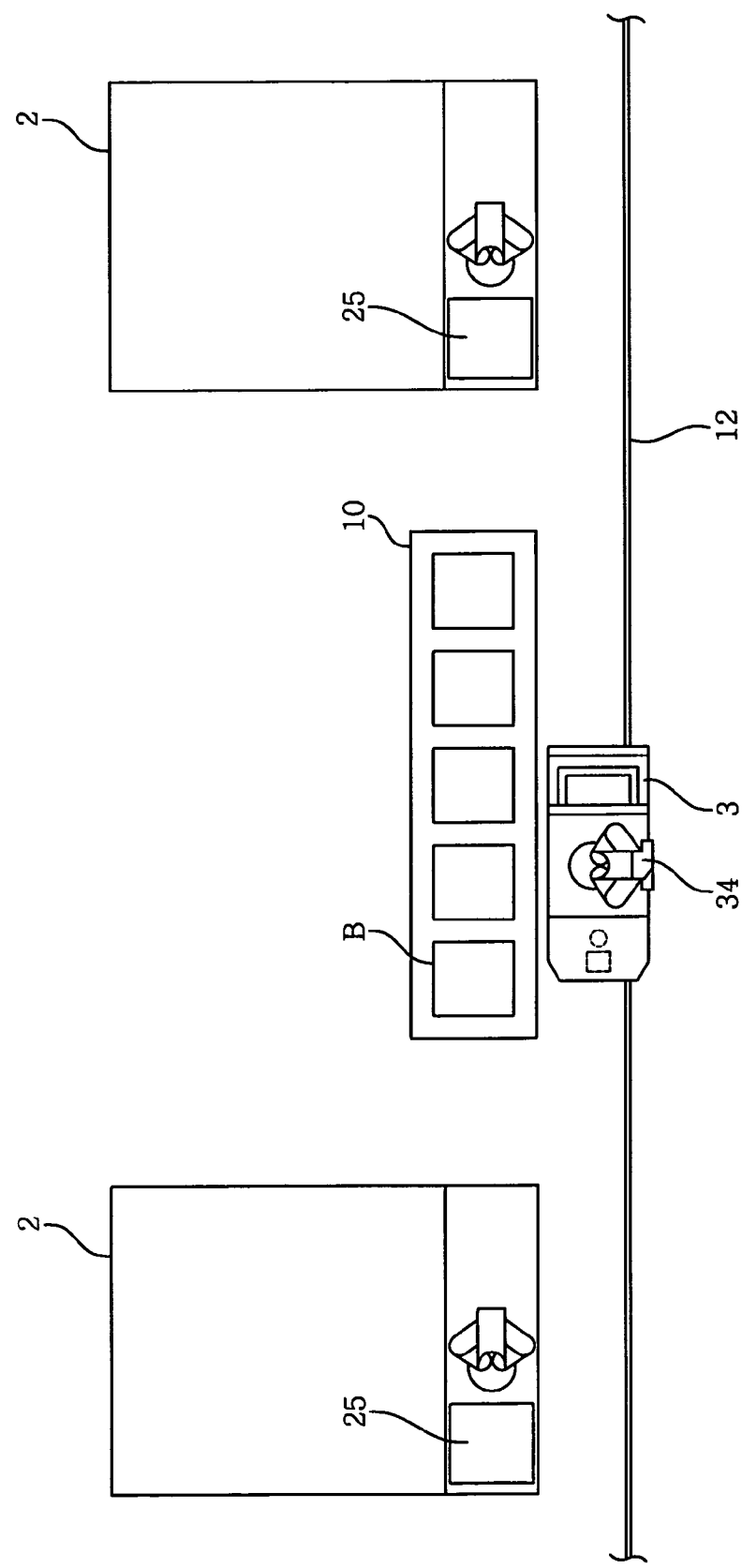
FIG. 2 describes an arrangement relationship among probers, an RGV and a stocker shown in FIG. 1.

FIG. 2 describes an arrangement relationship among the probers, the RGV and the stocker.

Referring to FIG. 2, each of the probers 2 has the adaptor units 25 as a delivery part for delivering the wafers between itself and the RGV 3. Further, the stocker 10 has the buffers B as a delivery part for delivering the wafers between itself and the RGV 3. A rail 12 is disposed to connect a location corresponding to the adaptor unit 25 of each probers 2 and locations corresponding to the respective buffers B of the stocker 10. The RGV 3 moves along the rail 12 and thus can freely move between each of the probers 2 and the stocker 10 and between the adjacent probers 2. Further, the RGV 3 has an RGV arm mechanism 34 to be described later in detail.

The RGV 3 transfers the wafers from the stocker 10 to the probers 2 and vice versa. To be specific, in case of transferring the wafers from the stocker 10 to the prober 2, the RGV arm mechanism 34 takes out a wafer from the buffer B when the RGV 3 is positioned to face the buffer B of the stocker 10, and then, the RGV 3 moves to the prober 2. Thereafter, the RGV arm mechanism 34 delivers the wafer taken from the buffer B to the adaptor unit 25 when the RGV 3 is stopped to face the adaptor unit 25 of the prober 2. Further, in case of transferring the wafers from the prober 2 to the stocker 10, the RGV arm mechanism 34 takes out a wafer from the adaptor unit 25 when the RGV 3 is positioned to face the adaptor unit 25 of the prober 2, and then, the RGV 3 moves to the stocker 10. Next, the RGV arm mechanism 34 delivers the wafer taken from the adaptor unit 25 to the buffer B when the RGV 3 is stopped to face the buffer B of the stocker 10.

Although the rail 12 is linearly arranged in FIG. 2, the arrangement shape thereof may be varied depending on a positional relationship between the probers 2 and the stocker 10.

Figure 3:
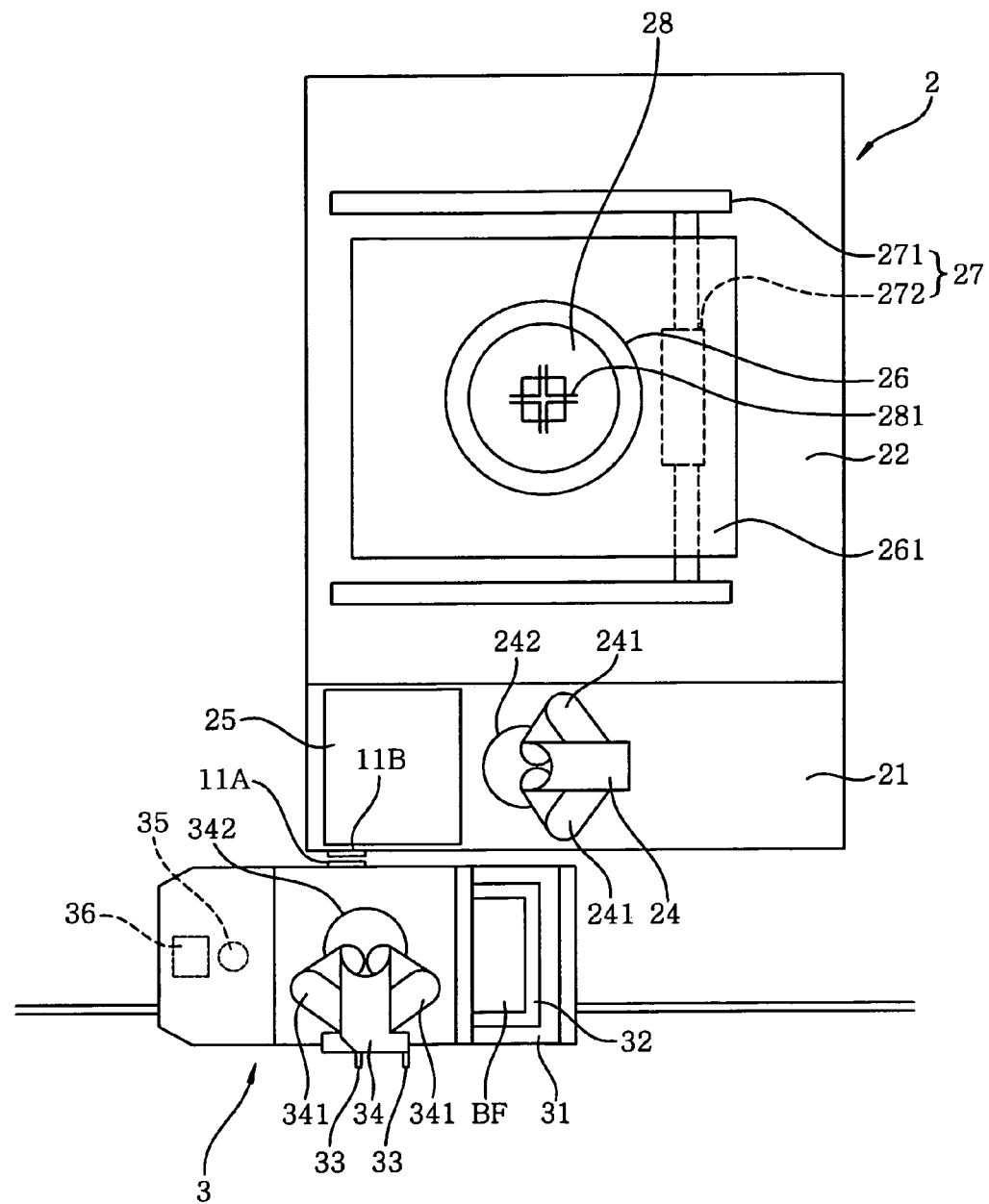
FIG. 3 explains a relationship between a prober and the RGV.

FIG. 3 explains a relationship between each prober and the RGV.

Referring to FIG. 3, the prober 2 includes a loader chamber 21, a prober chamber 22 and a controller (not shown). Further, the prober 2 drives every unit in the loader chamber 21 and the prober chamber 22 via the controller.

The loader chamber 21 includes a loader chamber transfer arm unit 24 and the adaptor unit 25. The loader chamber transfer arm unit 24 has two extensible and retractable transfer arms 241 arranged vertically; a base 242 rotatable in a horizontal plane, for supporting each of the transfer arms 241; and a driving mechanism (not shown) accommodated in the base 242, for elevating the base 242. In the load chamber transfer arm unit 24, each of the transfer arms 241 is configured to hold the wafer by vacuum absorption, and transfer it between the prober chamber 22 and the adaptor unit 25 by releasing the vacuum adsorption. Further, each of the transfer arms 241 has a leading end with two prongs, and more specifically, a bifurcated leading end with a semicircular cutout portion. Moreover, the loader chamber transfer arm unit 24 has a pre-alignment mechanism (not shown) for aligning the wafer delicately and carries out a pre-alignment of the wafer during the transfer of the wafer.

The adaptor unit 25, which is separable from the loader chamber 21, is engaged with the loader chamber 21 via a positioning member (not shown). Accordingly, a relative position relationship between the adaptor unit 25 and the loader chamber 21 may be restricted.

The prober chamber 22 has a main chuck 26 for vacuum-adsorbing the loaded wafer, an alignment mechanism 27 and a probe card 28. The main chuck 26 moves on an X-Y table 261 in X and Y directions and also moves in Z and θ directions by an elevating mechanism and a θ rotation unit (both being not shown). As well known, the alignment mechanism 27 has an alignment bridge 271, a CCD camera 272 and the like and cooperates with the main chuck 26 to align the wafer and the probe card 28. The probe card 28 has a plurality of probes 281. Each of the probes 281 is electrically contacted with the wafer on the main chuck 26. Further, the probe card 28 is connected with the tester 6 via a test head (not shown).

Moreover, the RGV 3 includes a main body 31; a buffer mount 32 provided at one end portion of the apparatus main body 31, for mounting thereon a buffer BF; a mapping sensor 33 for detecting a position of each wafer accommodated in the buffer BF; the RGV arm mechanism 34 for transferring the wafer between the buffer BF and the adaptor unit 25 (or the buffer B of the stocker 10); a sub-chuck 35 for pre-aligning the wafer; an optical pre-alignment sensor (not shown); and an OCR (Optical Character Recognizer) 36 for recognizing an ID code (not shown) of the wafer. The buffer BF mounted on the buffer mount 32 accommodates therein a plurality of wafers W of different diameters. For example, the buffer BF is vertically divided into an upper stage for accommodating therein a plurality of wafers having a diameter of 200 mm and a lower stage for accommodating therein a plurality of wafers having a diameter of 300 mm.

The RGV arm mechanism 34 includes the extensible and retractable transfer arms 341 (substrate transfer units) arranged vertically, for vacuum-adsorbing the wafer; a base 342 rotatable in a horizontal plane, for supporting each of the transfer arms 341; and a driving mechanism (not shown) accommodated in the base 342, for elevating the base 342. Each of the transfer arms 341 has at least one leading end portion (hereinafter, referred to as "pincette") for mounting thereon the wafer. As same as the leading end portions of the transfer arms 241, the pincette has a leading end with two prongs, and more specifically, a bifurcated leading end with a semicircular cutout portion. For example, in this embodiment, the upper transfer arm 341 has two pincettes and the lower transfer arm 341 has a single pincette. Accordingly, the upper transfer arms 341 can transfer two wafers W simultaneously. Herein, the two pincettes in the upper transfer arm 341 are preferably disposed spaced apart from each other by the same distance as an arrangement distance between a plurality of stage arms 41 in the adaptor unit 25 which will be described later. In this embodiment, the two pincettes are vertically spaced by, e.g., 20 mm. Further, each pincette has a vacuum adsorption device (not shown) for vacuum-adsorbing the wafer mounted thereon. The number of transfer arms 341 of the RGV arm mechanism 34 is not limited to two but may be one, or three or more.

In the RGV transfer arm 34, when the wafer is transferred to or from the adaptor unit 25, each of the transfer arms 341 separately extends and retracts on the base 342 by the driving mechanism. Further, the base 342 rotates in a direction of transferring the wafer, e.g., in a direction of approaching the adaptor unit 25, and also elevates to a height where the transfer of the wafer is carried out, e.g., to a height of the adaptor unit 25. Such operations in the RGV transfer arm 34 are also performed in the same manner when the wafer is transferred to or from the buffer B of the stocker 10.

In the substrate transfer system E, the RGV 3 moves between the stocker 10 and the probers 2 in response to a transfer sequence notified by wireless communications with the RGV controller 4, thereby transferring the wafers. For example, when the wafers are transferred from the stocker 10 to the probers 2, the RGV 3 supplies the wafers to the probers 2 at least one by one, e.g., two at a time, by using the RGV arm mechanism 24. When the RGV 3 arrives at a position where the wafers are to be delivered to a prober 2 (position corresponding to the adaptor unit 25) under the control of the RGV controller 4, the RGV arm mechanism 34 of the RGV 3 is driven, thereby loading the wafers into the adaptor unit 25 of the prober 2. When the wafers are loaded into the adaptor unit 25, the upper transfer arm 341 may load two wafers at a time into the adaptor unit 25, or each of the upper and the lower transfer arm 341 may load one wafer one after another into the adaptor unit 25. At this time, the RGV 3 and the prober 2 carry out the optically-coupled PIO communications therebetween via the communications interfaces 11A and 11B.

Further, when the wafers are transferred from the prober 2 to the stocker 10, the RGV 3 loads the wafers into the buffers B at least one by one, e.g., two at a time, by using the RGV arm mechanism 34. When the RGV 3 arrives at a position where the wafers are to be delivered to the stocker 10 (position corresponding to a buffer B) under the control of the RGV controller 4, the RGV arm mechanism 34 of the RGV 3 is driven, thereby loading the wafers into the buffer B of the stocker 10.

Figure 4:
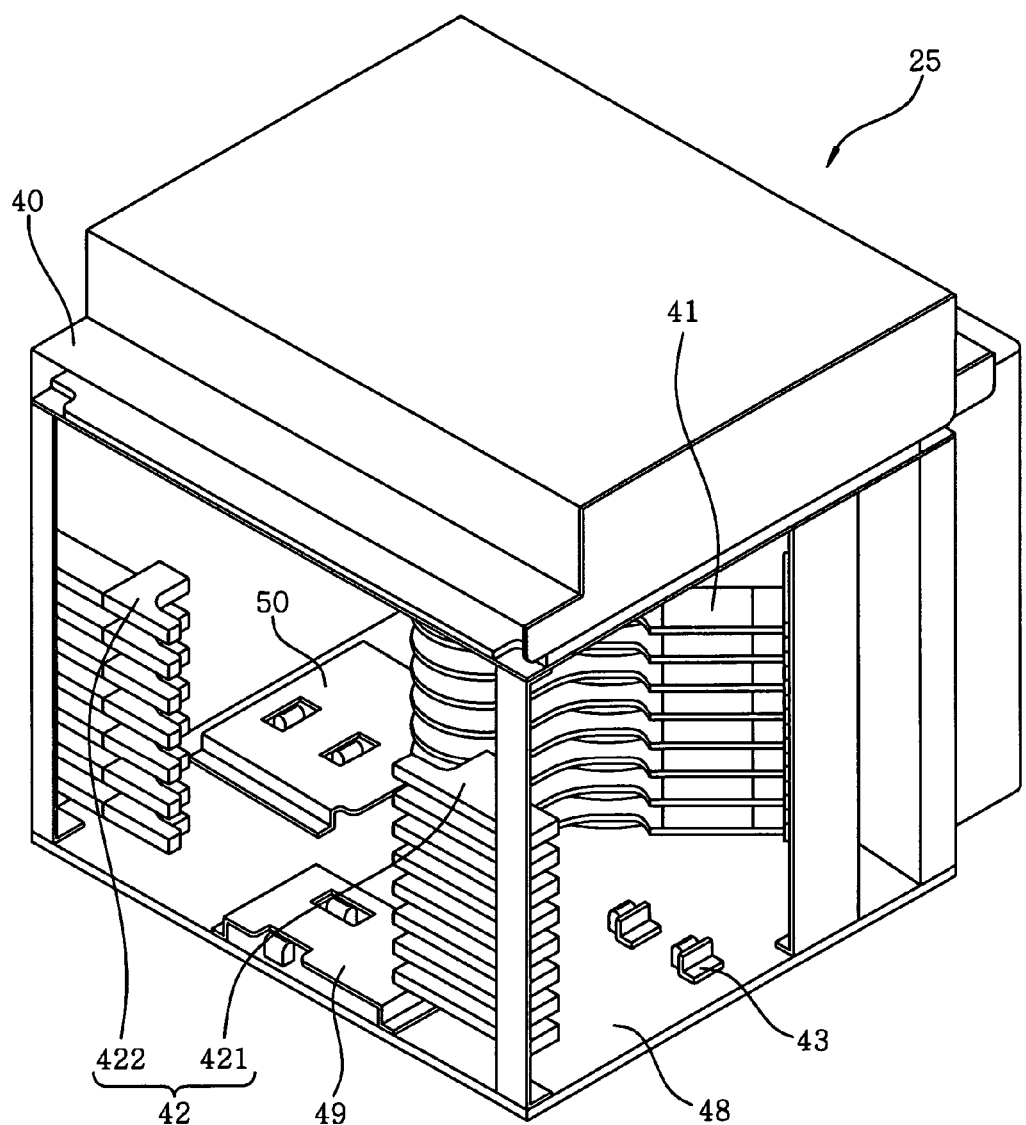
FIG. 4 provides a perspective view illustrating an external appearance of an adaptor unit of the prober.

FIG. 4 provides a perspective view illustrating an external appearance of the adaptor unit of the prober.

Referring to FIG. 4, the adaptor unit 25 includes a box-shaped main body 40; a plurality of stage arms 41 (substrate accommodating units) disposed in the main body 40; wafer position alignment mechanisms 42 provided as many as the number of the stage arms 41 in the main body 40; and a plurality of optical sensors 43 provided on a bottom surface 48 and a ceiling surface (not shown) facing each other.

The main body 40 has three open sides. Specifically, as shown in FIG. 3, the three open sides of the main body 40 includes a side facing the loader chamber transfer arm unit 24 of the prober 2, a side facing the RGV arm mechanism 34 of the RGV 3 which is stopped to correspond to the prober 2 and a side opposite to the side facing the RGV arm mechanism 34. Each of the open sides is substantially entirely opened. The transfer arm 241 of the loader chamber transfer arm unit 24 and the transfer arm 341 of the RGV arm mechanism 341 move into the main body 40 through the corresponding open sides, respectively.

The stage arms 41 are in parallel with the bottom surface 48 and mount thereon the wafers loaded into the main body 40 with the transfer arm 241 or 341 by supporting central portions of the wafers, whereby the wafers temporarily stored in the adaptor unit 25. Further, the transfer arm 241 or 341 unloads the wafers supported by the stage arms 41. In other words, the wafers are loaded and unloaded by the transfer arm 241 or 341 after being temporarily stored by the stage arms 41, which substantially results in the transfer of the wafers through the adaptor unit 25. In addition, the stage arms 41 vacuum-adsorb the mounted wafers by using vacuum adsorption devices thereof (not shown), and each of the stage arms 43 mounts thereon a single wafer.

In the adaptor unit 25, a plurality of, e.g., eight, stage arms 41 are vertically disposed spaced apart from each other at specific intervals of, e.g., 20 mm from the bottom surface 48 toward the ceiling surface. Further, the number of stage arms 41 is not limited to eight, and any number of stage arms may be provided within a range of 8 to 13 stage arms.

The wafer position alignment mechanism 42 includes locating blocks 421 and 422 with an L-shape as viewed from above. The locating blocks 421 and 422 are symmetrically arranged with respect to a moving track of the center of the wafer W transferred by the transfer arm 241 of the loader chamber transfer arm mechanism 24, i.e., with respect to a direction in which the wafer W is transferred by the transfer arm 241. A peripheral portion of the wafer transferred by the transfer arm 241 is contacted with the locating blocks 421 and 422, thereby carrying out a position alignment of the wafer.

Furthermore, the adaptor unit 25 has a plurality of, e.g., eight, optical sensors 43 on each of the bottom and the ceiling surface thereof. A misalignment of the wafers mounted on the stage arms 41 is detected by those optical sensors 43. Each of the optical sensors 43 has a wiring (not shown) to be connected to a detection result analysis apparatus (not shown) provided at an outside. Thus, in case the wirings protrude into the main body 40, they may interfere with the transfer arm 241 or 341. To that end, in this embodiment, wiring covers 49 and 50 for covering the wirings of the optical sensors 43 disposed below the approach path of the transfer arm 241 or 341 are provided on the bottom surface 48. Accordingly, it is possible to prevent the interference between each wiring and the transfer arm 241 or 341.

The stage arms of the adaptor unit 25 may support peripheral portions of the wafers, not the central portions thereof. In that case, each of the stage arms is preferably formed of two supporting members disposed to face each other with the wafer therebetween.

In the adaptor unit 25, two vertically adjacent stage arms 41 are spaced from each other with a gap of 20 mm therebetween. In the RGV arm mechanism 34, two pincettes of the upper transfer arm 341 are vertically spaced from each other with a gap of 20 mm therebetween. Consequently, two wafers can be simultaneously loaded into or unloaded from the adaptor unit 25 by the upper transfer arm 341.

The adaptor units of the probers 2 in the substrate transfer system E are not limited to the aforementioned adaptor units 25 each of which accommodates therein a plurality of wafers, but may be, e.g., those capable of accommodating a single wafer with a single wafer mounting table. The types of the adaptor units of the probers 2 are determined according to a time required for a processing in the corresponding prober 2. To be specific, when the time required for the processing is short, it is preferable to provide an adaptor unit capable of accommodating therein a plurality of wafers. On the other hand, when the time required for the processing is long, it is preferable to provide an adaptor unit capable of accommodating therein a single wafer.

Figure 5:
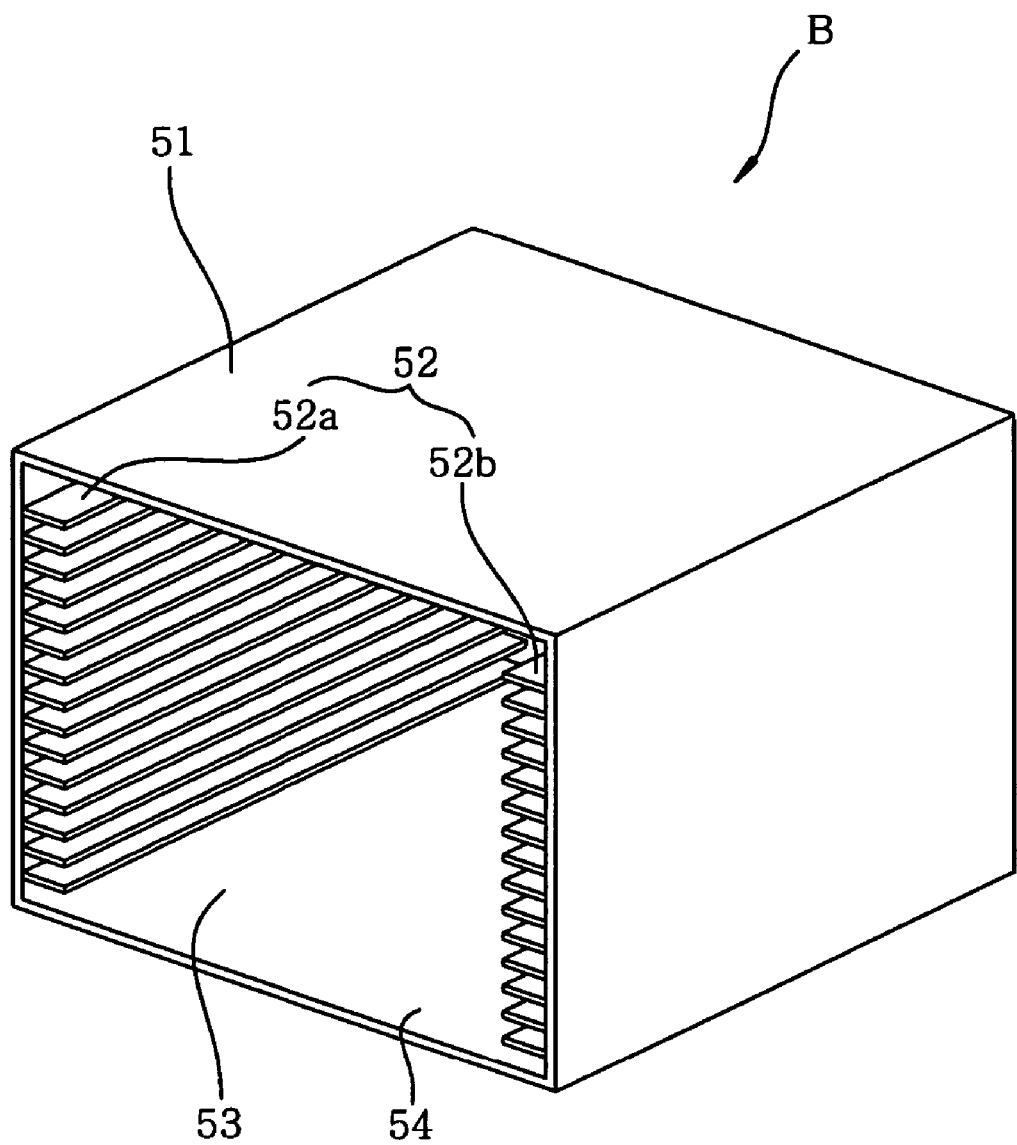
FIG. 5 presents a perspective view depicting an external appearance of a buffer of the stocker.

FIG. 5 presents a perspective view depicting an external appearance of a buffer of the stocker.

Referring to FIG. 5, the buffer B includes a box-shaped main body 51 and a plurality of wafer mounts 52 disposed in the main body 51. The main body 51 has one open side 53. Specifically, the open side 53 of the main body 51 is a side facing the RGV arm mechanism 34 of the RGV 3 which is stopped to correspond to the stocker 10. Although the open side is substantially entirely opened, it is closed by a lid (not shown) during the loading and/or unloading process performed by the operator. The transfer arm 341 of the RGV arm mechanism 34 moves into the main body 51 through the open side 53.

Each of the wafer mounts 52 has a pair of supporting members 52a and 52b respectively protruded in parallel with the bottom surface 54 from both sides adjacent to the open side 53. Further, the wafer mounts 52 mount thereon the wafers loaded into the main body 51 by the transfer arm 341 by supporting peripheral portions of the wafers. Accordingly, the wafers are temporarily stored in the buffer B. Further, the transfer arm 341 unloads the wafers supported by the wafer mounts 52. In other words, the wafers are loaded and unloaded by the transfer arm 341 after being temporarily stored in the wafer mounts 52, which substantially results in the transfer of the wafers through the buffer B. In addition, each of the wafer mounts 52 mounts thereon a single wafer.

The wafer mounts 52 in the buffer B are vertically disposed spaced apart from each other at specific intervals of, e.g., 20 mm from the bottom surface 53 toward the ceiling surface. Further, as described above, the two pincettes of the upper transfer arm 341 in the RGV arm mechanism 34 are spaced from each other with a gap of 20 mm therebetween. Consequently, two wafers can be simultaneously loaded into or unloaded from the buffer B by the upper transfer arm 341.

In the aforementioned substrate transfer system E, two wafers can be simultaneously loaded into or unloaded from the adaptor unit 25 or the buffer B by the upper transfer arm 341 of the RGV arm mechanism 34. Hence, the wafer transfer efficiency can be improved.

Hereinafter, there will be described a substrate transfer method in accordance with a preferred embodiment of the present invention.

In the conventional substrate transfer system, the RGV transfers wafers received from the stocker or the prober while accommodating them in the buffer of the corresponding RGV. Therefore, when the wafers are transferred to and from the stocker or the prober, the wafers need to be accommodated in or unloaded from the buffer, thereby hindering the improvement of the wafer transfer efficiency.

On the contrary, in the substrate transfer method in accordance with the present invention, the RGV 3 transfers wafers without accommodating them in the buffer BF.

Figure 6A:
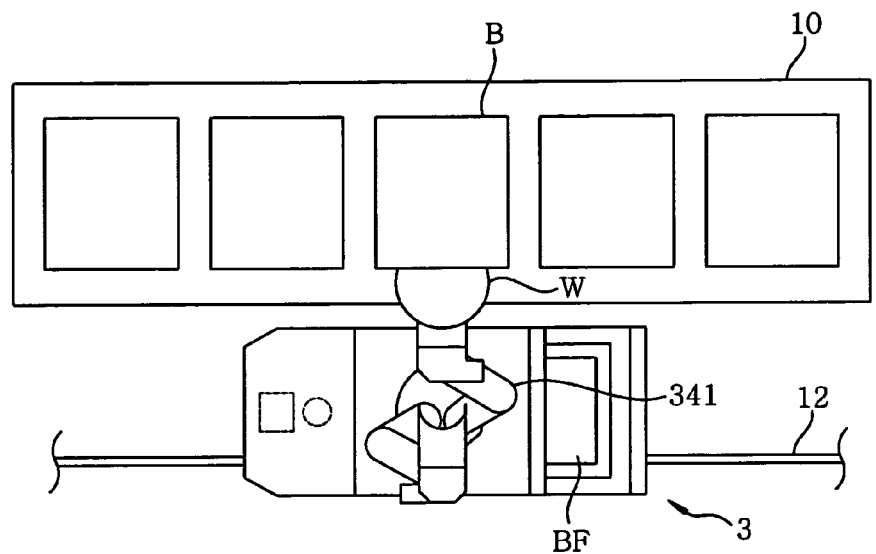
FIGS. 6A to 6C show an exemplary process of a substrate transfer method in accordance with the present invention.
Figure 6B:
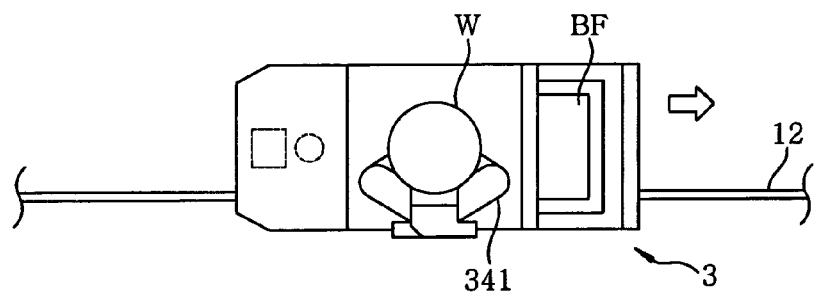
Figure 6C:
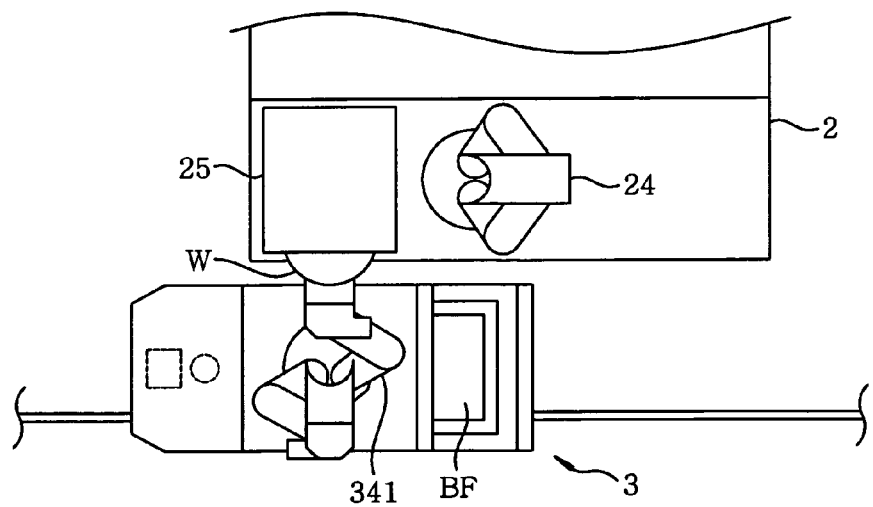

FIGS. 6A to 6C show an exemplary process of a substrate transfer method in accordance with the present invention.

Referring to FIGS. 6A to 6C, the RGV 3 that has arrived at a position corresponding to a buffer B of the stocker 10 moves the transfer arm 341 into the buffer B by extending the transfer arm 341, thereby unloading the wafers W from the buffer B (see FIG. 6A).

Next, the transfer arm 341 retracts while mounting thereon the unloaded wafers W. However, the wafers W are not accommodated in the buffer BF. In other words, the transfer arm 341 stops its operation while mounting thereon the wafers W. Further, the RGV 3 moves to a target prober 2 along the rail 12 while mounting the wafers W on the transfer arm 341 (see FIG. 6B).

Thereafter, the RGV 3 that has moved to the target prober 2 and stopped at a position corresponding to the adaptor unit 25 moves the transfer arm 341 into the adaptor unit 25 by extending the transfer arm 341 on which the wafers W are mounted, thereby loading the wafers W into the adaptor unit 25 (see FIG. 6C).

In accordance with the above-described substrate transfer method of FIGS. 6A to 6C, the transfer arm 341 stops its operation while mounting thereon the unloaded wafers W and, then, the RGV 3 moves while mounting the wafers W on the transfer arm 341. Therefore, the wafers W do not need to be accommodated in or unloaded from the buffer BF in the RGV 3. As a result, the transfer efficiency of the wafers W can be improved.

As for the transfer arm 341 for mounting thereon the wafers during the movement of the RGV 3, either the upper or the lower transfer arm 341 of the RGV arm mechanism 34 may be used. In case of using the upper transfer arm 341, two wafers can be unloaded at a time from the buffer B, as described above. That is, the RGV 3 can move while mounting two wafers on the upper transfer arm 341, so that the transfer efficiency of the wafers W can be further improved.

Moreover, the wafers may be unloaded from the buffer B by both the upper and the lower transfer arm 341, and the RGV 3 may move while mounting the wafers W on both the upper and the lower transfer arm 341. In this case, the transfer efficiency of the wafers W can be still further improved.

Although the RGV 3 moves from the stocker 10 to the prober 2 while mounting the wafers W on the transfer arm 341 in the aforementioned substrate transfer method of FIGS. 6A to 6C, the RGV 3 can also move from the prober 2 to the stocker 10 or from a prober 2 to another prober 2 while mounting the wafers W on the transfer arm 341. Consequently, it is possible to improve the efficiency of transferring the wafers W from the prober 2 to the stocker 10 or from a prober 2 to another prober 2.

In accordance with the aforementioned substrate transfer method of FIGS. 6A to 6C, since the freely extensible and retractable transfer arm 341 unloads the wafers W from the buffer B and loads the wafers W into the adaptor unit 25, the loading and unloading (transfer) of the wafers W can be effectively carried out. Consequently, the transfer efficiency of the wafers W can be further improved.

In accordance with the aforementioned substrate transfer method of FIGS. 6A to 6C, the transfer arm 341 does not accommodate the wafers W in the buffer BF. However, when a plurality of wafers W are unloaded from the buffer B by the transfer arm 341, the transfer arm 341 may mount thereon the wafer W unloaded for the last time while the other unloaded wafers W are stored in the buffer BF.

The transfer arm of the RGV in the conventional substrate transfer system transfers wafers toward a target location, i.e., a preset transfer destination of the wafers, and does not stop its operation, e.g., an extension or retraction, in other locations than the target location.

On the other hand, in accordance with the substrate transfer method of this embodiment, the transfer arm 341 that has unloaded the wafers W needs to stop its operation while mounting thereon the unloaded wafers W. Accordingly, in the substrate transfer system E, there is set a transfer arm operation stopping position where the transfer arm 341 stops its operation while mounting thereon the wafers W. The transfer arm operation stopping position is a retracted position of the transfer arm 341 that has unloaded the wafers W, and also corresponds to a position where the wafers W mounted on the transfer arm 341 are located at an approximate center of the RGV 3 (see FIG. 6B). In the substrate transfer system E, "ST" corresponding to the stocker 10, "BF" corresponding to the buffer BF of the RGV 3 and "EQ" corresponding to the prober 2 are set as the target locations, i.e., transfer destinations, of the wafers W and, also, "PBF" corresponding to the retracted position of the transfer arm 341 is set as the transfer arm operation stopping position.

In accordance with the above-described substrate transfer system E, by positioning the wafers W at "PBF" with the transfer arm 341 while the RGV 2 is moving, the RGV 3 can move while mounting the wafers W on the transfer arm 341. Consequently, the wafers W do not need to be accommodated in or unloaded from the buffer BF of the RGV 3. As a result, the transfer efficiency of the wafers W can be improved.

Since "PBF" may be set for both or either one of the upper and the lower transfer arm 341 of the RGV transfer arm mechanism 34, a variety of selectable wafer transfer types can be provided. Hence, the transfer efficiency of the wafer W can be further improved.

In the conventional substrate transfer system, a sequence of transferring wafers by the transfer arm (hereinafter, referred to as "transfer sequence") is set by a host computer. The host computer sets the transfer sequence by combining a plurality of transfer commands to be described later in response to an input from the operator or the like. The transfer commands serve to specify routes of transferring the wafers by the transfer arm, and the substrate transfer system is provided in advance with a plurality of commands corresponding to the combinable number of target locations as wafer transfer destinations. To be specific, each of the commands is stored in an HDD (not shown) of the host computer or the like.

In each of the transfer commands, transfer origins and transfer destinations of the wafers are specified. The transfer sequence thus set is transmitted to the RGV controller. Then, the RGV controller notifies the RGV of the transfer sequence through wireless communications. Next, the RGV moves between the stocker and the probers according to the notified transfer sequence, thereby transferring the wafers.

As described above, in the substrate transfer system E as a substrate transfer system in accordance with the preferred embodiment of the present invention, since "PBF" corresponding to the retracted position of the transfer arm 341 is provided in addition to "ST", "BF" and "EQ" as the target locations, there is prepared in advance a transfer command with "PBF" set as the wafer transfer origin or the wafer transfer destination. In other words, "PBF" is set as the transfer destination, the transfer origin or a stop-over location in transfer routes specified by a part of the transfer commands prepared in advance.

Hereinafter, there will be described a specific example of the transfer command in the substrate transfer system E.

Types of the transfer commands in the substrate transfer system E include a single operation mode in which a single transfer arm 341 transfers a wafer without cooperating with the other transfer arms 341; a consecutive operation mode in which the upper and the lower transfer arm 341 consecutively transfer wafers along a same transfer route; and an alternate operation mode in which a single transfer arm 341 unloads a wafer from the adaptor unit 25 or the buffer B and, then, another transfer arm 341 loads a wafer into the adaptor unit 25 or the buffer B.

The following Table 1 shows lists of the pre-prepared transfer commands of the single operation mode that are prepared in advance in the substrate transfer system E. FIG. 7 illustrates transfer routes specified by the transfer commands of the single operation mode.

Referring to Table 1, "CASE" indicates a title of the transfer commands; "FROM" represents a transfer origin; and "TO" indicates a transfer destination. Further, shaded transfer origins and transfer destinations represent stop-over locations in the transfer commands. For example, the transfer command E specifies a transfer route from "ST" to "EQ" via "PBF". To be specific, the wafer is transferred from "ST" to "PNF" and then from "PNF" to "EQ" in the transfer command E.

Referring to FIG. 7, the transfer routes specified by the transfer commands are indicated by arrows. Among them, the transfer commands indicated in parentheses specify reverse transfer routes of the corresponding transfer commands.

In comparison with the conventional substrate transfer system, the substrate transfer system E is additionally provided with "PBF". Therefore, the transfer commands of "A-1", "A-2", "B-1", "B-2", "C-1", "C-2", "D-1", "D-2", "E", "F", "G", "H" and "I" are added in the single operation mode.

Figure 8:
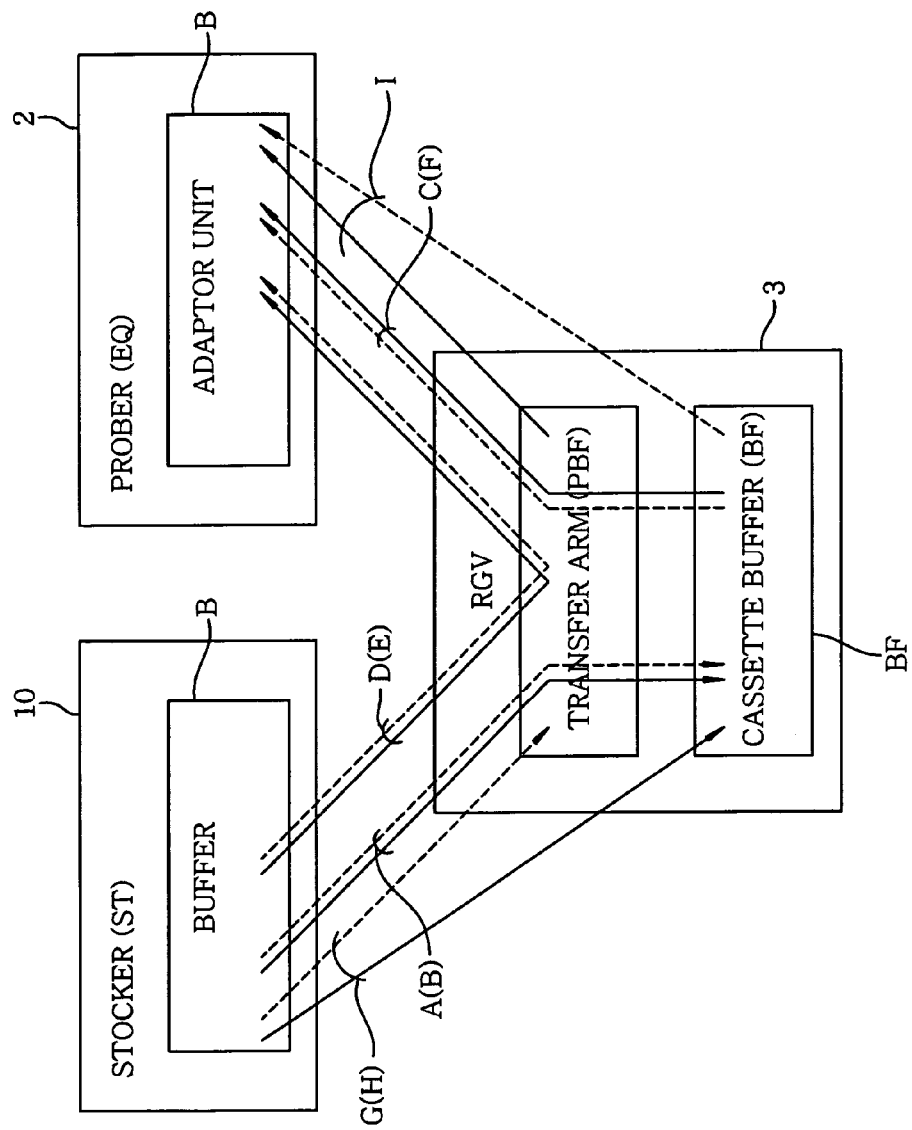
FIG. 8 illustrates transfer routes specified by transfer commands of a consecutive operation mode.

The following Table 2 illustrates lists of the transfer commands of the consecutive operation mode prepared in advance in the substrate transfer system E. FIG. 8 illustrates transfer routes specified by the transfer commands of the consecutive operation mode.

TABLE 1

| CASE | TRANSFER | |
|---|---|---|
| | FROM | TO |
| A | ST | BF |
| A-1 | ST | PBF |
| A-2 | PBF | BF |
| B | BF | EQ |
| B-1 | BF | PBF |
| B-2 | PBF | EQ |
| C | EQ | BF |
| C-1 | EQ | PBF |
| C-2 | PBF | BF |
| D | BF | ST |
| D-1 | BF | PBF |
| D-2 | PBF | ST |
| E | ST | EQ |
| | *ST* | *PBF* |
| | *PBF* | *EQ* |
| F | EQ | ST |
| | EQ | PBF |
| | PBF | ST |
| G | EQ | EQ |
| | *EQ* | *PBF* |
| | *PBF* | *EQ* |
| H | ST | ST |
| | *ST* | *PBF* |
| | *PBF* | *ST* |
| I | BF | BF |
| | *BF* | *PBF* |
| | *PBF* | *BF* |

TABLE 2

| CASE | TRANSFER | | | |
|---|---|---|---|---|
| | UPPER ARM | | LOWER ARM | |
| | FROM | TO | FROM | TO |
| A | ST | BF | ST | BF |
| | *ST* | *PBF* | *ST* | *PBF* |
| | *PBF* | *BF* | *PBF* | *BF* |
| B | BF | ST | BF | ST |
| | *BF* | *PBF* | *BF* | *PBF* |
| | *PBF* | *ST* | *PBF* | *ST* |
| C | BF | EQ | BF | EQ |
| | *BF* | *PBF* | *BF* | *PBF* |
| | *PBF* | *EQ* | *PBF* | *EQ* |
| D | ST | EQ | ST | EQ |
| | *ST* | *PBF* | *ST* | *PBF* |
| | *PBF* | *EQ* | *PBF* | *EQ* |
| E | EQ | ST | EQ | ST |
| | *EQ* | *PBF* | *EQ* | *PBF* |
| | *PBF* | *ST* | *PBF* | *ST* |
| F | EQ | BF | EQ | BF |
| | *EQ* | *PBF* | *EQ* | *PBF* |
| | *PBF* | *BF* | *PBF* | *BF* |
| G | ST | BF | ST | BF |
| H | BF | ST | BF | ST |
| I | PBF | EQ | PBF | EQ |

The "CASE", "FROM" and "TO" in Table 2 are the same as those in Table 1. The meaning of the shaded portions is the same as that in Table 1.

Referring to FIG. 8, among the transfer routes indicated by arrows, the solid lines represent transfer routes of the upper transfer arm 341, and the dotted lines represent transfer routes of the lower transfer arm 341. Moreover, the transfer commands in parentheses specify reverse transfer routes of the corresponding transfer commands.

In the transfer commands "A" to "I" of the consecutive operation mode, there is set "PNF" as the stop-over location, the transfer destination or the transfer origin. Those transfer commands are not provided in the conventional substrate transfer system.

TABLE 3

| | TRANSFER | | | |
|---|---|---|---|---|
| | UPPER ARM | | LOWER ARM | |
| CASE | FROM | TO | FROM | TO |
| A | BF | EQ | EQ | BF |
| B | EQ | BF | BF | EQ |
| C | ST | EQ | EQ | ST |
| D | EQ | ST | ST | EQ |
| E | ST | BF | BF | ST |
| F | BF | ST | ST | BF |
| G | PBF | EQ | EQ | PBF |
| H | EQ | PBF | PBF | EQ |
| I | PBF | ST | ST | PBF |
| J | ST | PBF | PBF | ST |
| K | EQ | BF | PBF | EQ |
| L | EQ | PBF | BF | EQ |

Figure 9:
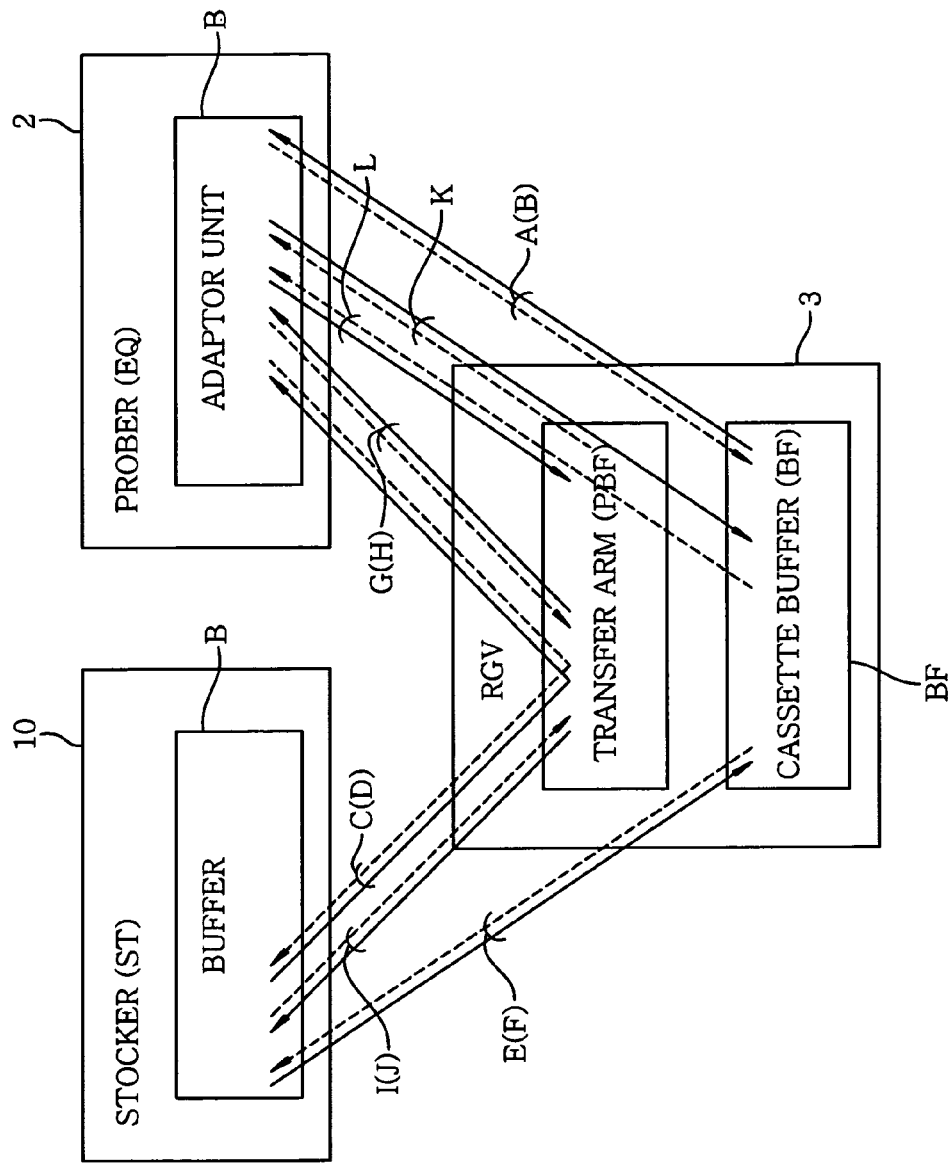
FIG. 9 depicts transfer routes specified by transfer commands of an exchange operation mode.

The following Table 3 shows lists of the transfer commands of the alternate operation mode prepared in advance in the substrate transfer system E. FIG. 9 depicts transfer routes specified by the transfer commands of the exchange operation mode.

The "CASE", "FROM" and "TO" in Table 3 are the same as those in Table 1.

Referring to FIG. 9, among the transfer routes indicated by arrows, the solid lines represent transfer routes of the upper transfer arm 341, and the dotted lines represent transfer routes of the lower transfer arm 341. Moreover, the transfer commands in parentheses specify reverse transfer routes of the corresponding transfer commands.

In the transfer commands "C", "D", "G", "H", "I", "J", "K" and "L" of the alternate operation mode, there is set "PNF" as the stop-over location, the transfer destination or the transfer origin. Those transfer commands are not provided in the conventional substrate transfer system.

In accordance with the aforementioned substrate transfer system E, the host computer 1 sets a wafer transfer sequence by combining a plurality of transfer commands including those for specifying transfer routes in which "PNF" is set. Accordingly, the RGV 3 can move while mounting the wafers on the transfer arm 341 at the location of "PNF" in the transfer sequence thus set. Hence, the wafers do not need to be accommodated in or unloaded from the buffer of the RGV 3, so that the wafer transfer efficiency can be improved.

Further, in accordance with the above-described substrate transfer system E, since "PNF" is set as the stop-over location, the transfer destination or the transfer origin in the transfer route, types of the transfer commands and flexibility of setting a transfer sequence can be significantly increased compared with the conventional substrate transfer system. For example, the wafer transfer time can be greatly reduced by setting the transfer sequence with an optimal combination of the transfer commands. As a result, the wafer transfer efficiency can be further improved.

In the aforementioned substrate transfer system E, when the host computer 1 sets the transfer sequence by using the transfer commands of the consecutive operation mode or those of the alternate operation mode, a common transfer sequence is set for the upper and the lower transfer arm 341. However, the host computer 1 may set separate transfer sequences for the upper and the lower transfer arm 341, respectively, without using the transfer commands of the consecutive operation mode or the alternate operation mode. In this case, the transfer sequence of the upper transfer arm 341 is different from that of the lower transfer arm 341. Therefore, the flexibility of setting the transfer sequence can be further increased.

In the transfer commands of the alternate operation mode in the substrate transfer system E, one transfer arm 341 unloads the wafer from the adaptor unit 25 or the buffer B and, successively, another transfer arm 341 loads another wafer into the adaptor unit 25 or the buffer B, so that the wafers can be rapidly exchanged. Therefore, if the transfer sequence is set by using the transfer commands of the alternate operation mode, the wafer transfer efficiency can be further improved.

In the transfer commands of the consecutive operation mode in the substrate transfer system E, the upper and the lower transfer arm 341 consecutively transfer the wafers along the same transfer routes, thereby consecutively transferring a plurality of wafers. Consequently, if the transfer sequence is set by using the transfer commands of the consecutive operation mode, the wafer transfer efficiency can be further improved.

Hereinafter, there will be described a wafer transfer process in the substrate transfer system of FIG. 1.

In the conventional substrate transfer system, the RGV that has moved to a prober according to transfer sequence carries out the optically-coupled PIO communications with the prober and, then, the prober informs the host computer of the arrival of the RGV and the state of the prober, e.g., whether or not the prober can receive the wafers. Next, the host computer that has received the information notifies the prober of specifications of the wafers transferred by the RGV, e.g., an ID number, a processing history, processing details (recipe data), a processing time, a processing priority and wafer mounting positions of the stage arms (slot numbers). Thereafter, the prober that has received the information notifies the RGV that the loading of the wafer is allowed. The RGV that has received the information loads the wafer into the adaptor unit.

However, since the prober informs the host computer of the state of the prober after the RGV has moved to the prober. The process of moving the RGV from the stocker to the prober may be wasted if the prober cannot receive the wafer.

Further, after the vacuum adsorption devices are driven, a specific period of time is required until the stage arms of the adaptor unit can vacuum-adsorb. Thus, in case of driving the vacuum adsorption devices of the stage arms corresponding to the slot numbers received from the host computer after the RGV has moved to the prober, there may be needed a waiting time for loading the wafer into the adaptor unit.

On the other hand, in the wafer transfer process to be described later in detail, before the RGV reaches the prober, the host computer informs the prober of specifications of the wafers to be transferred and, also, the prober informs the host computer of its state.

Figure 10:
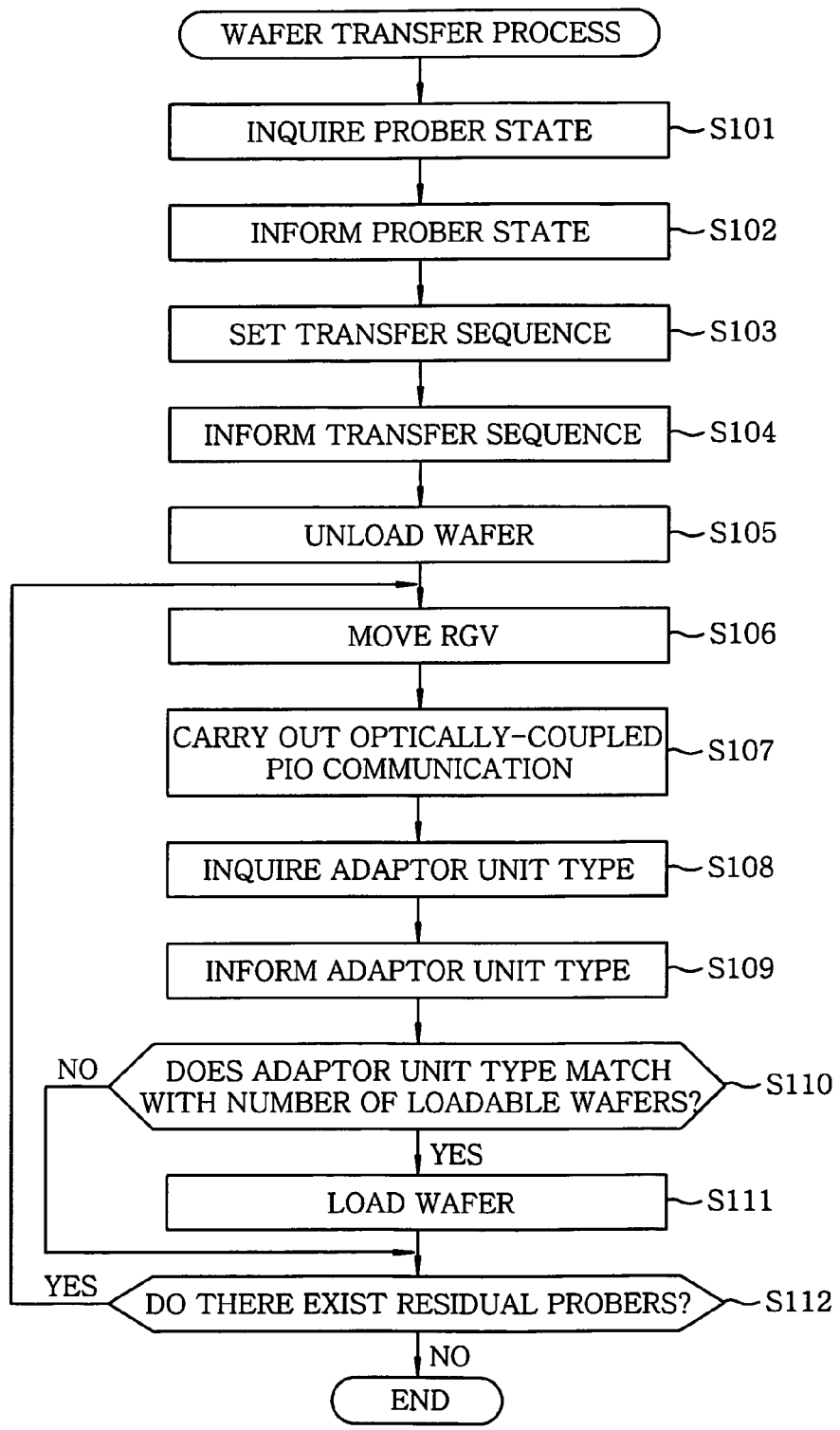
FIG. 10 provides a flowchart of a wafer transfer process in the substrate transfer system shown in FIG. 1.

FIG. 10 provides a flowchart of the wafer transfer process in the substrate transfer system shown in FIG. 1.

Referring to FIG. 10, when an instruction of a specific testing process is inputted by the operator, the host computer 1 informs the probers 2, each for performing an electrical characteristic test of the wafer during the testing process, of specifications of the wafers to be transferred, e.g., an ID number, a processing history, processing details (recipe data), a processing time, a processing priority and a slot number, and also inquires about the state of the probers 2 (step S101) (state inquiring step).

Next, the probers 2 prepare to receive the wafers based on the received specifications of the wafers, for example, the vacuum adsorption devices of the stage arms 41 corresponding to the received slot numbers are driven. Also, the probers 2 inform the host computer 1 of their state, e.g., whether or not they can receive the wafers, whether or not the stage arms 41 corresponding to the received slot numbers are mounting thereon the wafers (whether or not they are empty slots) and the number of stage arms 41 having thereon no wafer (the number of empty slots) (step S102) (state informing step).

Then, the host computer 1 that has received the states of the probers 2 sets a transfer sequence in accordance with the states of the probers (step S103) (transfer sequence setting step). For example, when there exists a prober 2 that is not able to receive the wafers, the transfer sequence is set to pass by the corresponding prober 2. Further, the host computer 1 selects the transfer arm 341 for loading the wafers into the adaptor unit 25 in accordance with the received number of empty slots. To be more specific, when there is a plurality of empty slots and also at least two empty slots are adjacent to each other, the transfer sequence is set such that two wafers are loaded at a time into the adaptor unit 25 by the upper transfer arm 34. On the other hand, when there exists a single empty slot or when no empty slots are adjacent to each other, the transfer sequence is set such that a single wafer is loaded into the adaptor unit 25 by the lower transfer arm 341.

Thereafter, the host computer 1 transmits the transfer sequence thus set to the RGV controller 4 and, then, the RGV controller 4 informs the RGV 3 of the transfer sequence through wireless communications (step S104) (transfer sequence informing step).

Next, the RGV 3 moves to the stocker 10 according to the inputted transfer sequence and unloads a specific number of wafers from the stocker 10 (step S105). Then, the RGV 3 stores some of the wafers into the buffer BF and moves to a predetermined prober 2 while mounting the rest wafers on the transfer arm 341 (step S106) (moving step).

When having moved to the corresponding prober 2, the RGV 3 carries out the optically-coupled PIO communications with the prober 2 (step S107). At this time, the RGV 3 informs the prober 2 of its arrival and also inquires about the type of the adaptor unit of the prober 2 (step S108) (substrate delivery part type inquiring step). Then, the prober 2 informs the RGV 3 of the type of the adaptor unit thereof (step S109) (substrate delivery part type informing step).

Next, the RGV 3 determines whether or not the type of the adaptor unit matches with the number of wafers that can be loaded by the transfer arm 341 which is specified in the transfer sequence (step S110). When they match with each other, e.g., when the adaptor unit is the adaptor unit 25 capable of receiving a plurality of wafers and also when the transfer arm 341 specified in the transfer sequence corresponds to the upper or the lower transfer arm 341, the wafers are loaded into the adaptor unit (step S111). On the other hand, when they do not match with each other, e.g., when the adaptor unit is an adaptor unit capable of receiving only a single wafer and also when the transfer arm 341 specified in the transfer sequence is the upper transfer arm 341, it is allowed to skip step S111 and then proceed to step S112 without loading the wafer into the adaptor unit. Moreover, when there is no reply from the prober 2 for a specific period of time after the RGV 3 inquires about the type of the adaptor unit of the prober 2 in step S108, the RGV 3 immediately proceeds to step 112.

Thereafter, the RGV 3 determines whether or not there remain probers 2 as a wafer transfer destination specified in the transfer sequence (step S112). When the probers 2 as the transfer destination remain, the process returns to step S106. Otherwise, the corresponding process is completed.

In accordance with the wafer transfer process of FIG. 10, the host computer 1 informs the prober 2 of the specifications of the wafers to be transferred and also inquires about the state of the prober 2 (step S101). Then, the prober 2 informs the host computer 1 of its state (step S102). The host computer 1 sets a transfer sequence based on the state of the prober 2 (step S103) and then informs the RGV 3 of the transfer sequence thus set via the RGV controller 4 (step S104). Accordingly, the prober 2 can be informed of the specifications of the wafers to be transferred in advance and thus does not need to inquire of the host computer 1 the specifications of the wafers after the wafers have been moved thereto. Further, when the prober 2 is not able to receive the wafers, the RGV 3 can pass by the corresponding prober 2. As a result, the wafer transfer efficiency can be improved. Furthermore, since the prober 2 is informed of the specifications of the wafers to be transferred in advance, even if communication errors occur between the host computer 1 and the prober 2 after the RGV 3 starts to move, testing processes after that are not hindered thereby.

Further, in the wafer transfer process of FIG. 10, the RGV 3 moves while mounting the wafers on the transfer arm 341 (step S106) and thus the wafers do not need to be accommodated in or unloaded from the buffer BF in the RGV 3. Hence, the wafer transfer efficiency can be further improved.

Furthermore, in the wafer transfer process of FIG. 10, the prober 2 informs the RGV 3 of the type of the adaptor unit (step S109) before the wafers are loaded thereinto by the RGV 3. Therefore, it is possible to confirm whether or not the number of wafers that can be loaded into the prober 2 at a time by the RGV 3 matches with the number of wafers that can be received at a time by the prober 2, thereby carrying out the delivery of the wafers without fail. As a result, even if the operator exchanges the adaptor unit of the prober 2 while the RGV 3 is moving, there occurs no problem in loading the wafers into the adaptor unit.

In accordance with the wafer transfer process of FIG. 10, when the transfer sequence is set, the transfer arm 341 for delivering wafers to the adaptor unit is selected based on the number of empty slots. Consequently, it is possible to match the number of empty slots with the number of wafers that can be loaded by the transfer arm 341. As a result, the wafer transfer efficiency can be improved.

In the wafer transfer processing of FIG. 10, when there exists a single empty slot, the lower transfer arm 341 capable of loading only a single wafer is selected. Hence, it is possible to prevent the transfer arm 341 from failing to deliver the wafer to the adaptor unit.

Although the aforementioned substrate transfer system E has a prober as a substrate processing apparatus, the substrate processing apparatus is not limited thereto but may be a plasma processing apparatus (an etching processing apparatus, a CVD processing apparatus and the like), for example. Further, the substrate processing apparatus of the substrate transfer system E is not limited to a single wafer processing apparatus but may be an apparatus for batch processing a plurality of wafers. Furthermore, the substrate transfer system E may have a single substrate processing apparatus, not a plurality of substrate processing apparatuses.

The transferred substrate in the substrate transfer system E is not limited to a wafer for a semiconductor device but may be a substrate for use in an LCD (Liquid Crystal Display), an FTD (Flat Panel Display) or the like. It may also be a photo mask, a CD substrate, a print substrate or the like.

The object of the present invention can also be achieved by supplying a storage medium for storing therein software program codes for implementing functions of the aforementioned embodiments to a computer, e.g., the host computer 1 or the RGV controller 4, and then executing the program codes stored in the storage medium by a CPU of the computer.

In this case, it is considered that the functions of the aforementioned embodiments are implemented by the program codes, by themselves, read from the storage medium, so that the program codes and the storage medium for storing therein the program codes are included in the present invention.

The storage medium for supplying the program codes includes a RAM, a NV-RAM, a Floppy (registered mark) disc, a hard disc, an optical disc, an magneto-optical disc, a CD-ROM, a CD-R, a CD-RW, a DVD (DVD-ROM, DVD-RAM, DVD-RW, DVD+RW), a magnetic tape, a nonvolatile memory card, another ROM and the like, which are capable of storing therein the program codes. Alternatively, the program codes may be supplied to the computer through a download from a database or another computer (not shown) connected to the Internet, a commercial network, a local area network or the like.

Further, the functions of this embodiments are achieved not only by executing the program codes read by the computer but also by implementing a partial or an entire actual process by the OS (Operating System) or the like in running on the CPU, based on instructions of the program codes.

In addition, the functions of this embodiments can be implemented by writing the program codes of the storage medium to a memory provided in a function extension board inserted in the computer or a function extension unit connected to the computer and then performing a partial or an entire actual process by the CPU or the like provided in the function extension board or in the function extension unit, based on instructions of the program codes.

The program codes may include object codes, program codes run by an interpreter, script data supplied to the OS and the like.

While the invention has been shown and described with respect to the preferred embodiments, it will be understood by those skilled in the art that various changes and modification may be made without departing from the scope of the invention as defined in the following claims.

What is claimed is:

1. A substrate transfer system, comprising:
    a substrate storing apparatus for storing therein one or more substrates;
    at least one substrate processing apparatus which performs a predetermined processing on the substrate; and
    a substrate transfer apparatus which transfers the substrate by moving along a rail between the substrate storing apparatus and the substrate processing apparatus, the substrate transfer apparatus including at least one substrate transfer unit which supports the substrate, which unloads the substrate from the substrate storing apparatus or the substrate processing apparatus, and which loads the substrate into the substrate storing apparatus or the substrate processing apparatus,
    wherein the substrate transfer apparatus moves while supporting the substrate by the substrate transfer unit, and
    wherein the substrate transfer unit is a transfer arm which carries the substrate while the substrate transfer apparatus moves between the substrate storing apparatus and the substrate processing apparatus.

2. The substrate transfer system of claim 1, wherein the substrate transfer apparatus includes a plurality of the substrate transfer units, and at least one of the substrate transfer units supports a plurality of the substrates.

3. The substrate transfer system of claim 1, wherein the substrate transfer system includes a plurality of the substrate processing apparatuses, and the substrate transfer apparatus moves between the substrate processing apparatuses.

4. A substrate transfer apparatus for transferring one or more substrate by moving along a rail between a substrate storing apparatus for storing therein the substrate and at least one substrate processing apparatus for performing a predetermined processing on the substrate, the substrate transfer apparatus comprising:
    at least one substrate transfer unit which supports the substrate, which unloads the substrate from the substrate storing apparatus or the substrate processing apparatus, and which loads the substrate into the substrate storing apparatus or the substrate processing apparatus,
    wherein the substrate transfer apparatus moves while supporting the substrate by the substrate transfer unit, and
    wherein the substrate transfer unit is a transfer arm which carries the substrate while the substrate transfer apparatus moves between the substrate storing apparatus and the substrate processing apparatus.

5. A computer-readable storage medium for storing therein a program for executing on a computer a substrate transfer method in a substrate transfer system including a substrate storing apparatus which stores therein one or more substrates, at least one substrate processing apparatus which performs a predetermined processing on the substrate and a substrate transfer apparatus which transfers the substrate while moving along a rail between the substrate storing apparatus and the substrate processing apparatus, the substrate transfer apparatus having at least one substrate transfer unit which supports the substrate, which unloads the substrate from the substrate storing apparatus or the substrate processing apparatus, and which loads the substrate into the substrate storing apparatus or the substrate processing apparatus,
    wherein the program includes a moving module which moves the substrate transfer apparatus while supporting the substrate by the substrate transfer unit, and
    wherein the substrate transfer unit is a transfer arm which carries the substrate while the substrate transfer apparatus moves between the substrate storing apparatus and the substrate processing apparatus.

6. The substrate transfer system of claim 1, wherein there is set an operation stopping position at which the substrate transfer unit stops its operation while supporting the substrate.

7. The substrate transfer system of claim 6, wherein the substrate transfer apparatus includes a plurality of the substrate transfer units, and at least one of the substrate transfer units stops its operation at the operation stopping position.

8. The computer-readable storage medium of claim 5, wherein the program further includes a substrate supporting module which stops an operation of the substrate transfer unit while the latter supports the substrate.

9. The substrate transfer system of claim 6, further comprising a controller which sets a transfer sequence of the substrate by combining a plurality of transfer commands, each transfer command specifies a transfer route of the substrate transferred by the substrate transfer unit, wherein, in the transfer route specified by at least one of the transfer commands, the operation stopping position is set.

10. The substrate transfer system of claim 9, wherein the substrate transfer apparatus includes a plurality of the substrate transfer units, and the controller sets the transfer sequence to have the transfer routes of the substrates transferred by each of the substrate transfer units different from each other.

11. The substrate transfer system of claim 10, wherein at least one of the substrate transfer units loads the substrates into the substrate storing apparatus or the substrate processing apparatus, and at least one of the other substrate transfer units unloads the substrates therefrom, in the transfer sequence.

12. The substrate transfer system of claim 9, wherein the substrate transfer apparatus includes a plurality of substrate transfer units, and the controller sets the transfer sequence to have the substrates be transferred consecutively by the substrate transfer units.

13. The substrate transfer system of claim 1, wherein the substrate processing apparatus includes a first substrate delivery part which delivers a plurality of the substrates by temporarily storing therein the substrates while vertically spacing the substrates apart from one another at a specific interval, and the substrate transfer unit supports the substrates while vertically spacing the substrates apart from one another at the specific interval.

14. The substrate transfer system of claim 13, wherein the substrate storing apparatus includes a second substrate delivery part which delivers a plurality of the substrates by temporarily storing therein the substrates while vertically spacing the substrates apart from one another at the specific interval.

15. A substrate transfer system, comprising:
a substrate storing apparatus for storing therein one or more substrates while vertically spacing the substrates apart from one another at a specific interval;
at least one substrate processing apparatus which performs a predetermined processing on the substrate; and
a substrate transfer apparatus which transfers the substrate by moving along a rail between the substrate storing apparatus and the substrate processing apparatus,
wherein the substrate processing apparatus includes a substrate delivery part which delivers the substrate by temporarily storing therein the substrate, the substrate delivery part includes a plurality of substrate accommodating units vertically spaced apart from one another at the specific interval, each for accommodating therein a single substrate,
the substrate transfer apparatus includes a plurality of substrate transfer units which supports the substrate, which unloads the substrate from the substrate storing apparatus or the substrate processing apparatus, and which loads the substrate into the substrate storing apparatus or the substrate processing apparatus, at least one of the substrate transfer units supporting a plurality of the substrates while vertically spacing the substrates apart from one another at the specific interval and at least one of the other substrate transfer units supporting a single substrate,
and, among the substrate transfer units, the substrate transfer units which deliver the substrates to the substrate delivery part are selected in accordance with the number of the substrate accommodating units having no substrate in the substrate delivery part, and
wherein the substrate transfer unit is a transfer arm which carries the substrate while the substrate transfer apparatus moves between the substrate storing apparatus and the substrate processing apparatus.

16. The substrate transfer system of claim 15, wherein when only one substrate accommodating unit has no substrate in the substrate delivery part, the substrate transfer unit which supports a single substrate is selected.

17. A computer-readable storage medium for storing a program for executing on a computer a substrate transfer method in a substrate transfer system including a substrate storing apparatus which stores therein one or more substrate while vertically spacing the substrates apart from one another at a specific interval; at least one substrate processing apparatus which performs a predetermined processing on the substrate; and a substrate transfer apparatus which transfers the substrate by moving along a rail between the substrate storing apparatus and the substrate processing apparatus, the substrate processing apparatus including a substrate delivery part which delivers the substrate by temporarily storing therein the substrate, the substrate delivery part including a plurality of substrate accommodating units vertically spaced apart from one another at the specific interval, each substrate accommodating unit accommodates a single substrate, the substrate transfer apparatus including a plurality of substrate transfer units which supports the substrates, which unloads the substrates from the substrate storing apparatus or the substrate processing apparatus, and which loads into the substrate storing apparatus or the substrate processing apparatus, at least one of the substrate transfer units supporting a plurality of the substrates while vertically spacing the substrates apart from one another at the specific interval and at least one of the other substrate transfer units supporting a single substrate,
wherein the program includes a substrate transfer unit selecting module which selects at least one substrate transfer unit which delivers the substrate to the substrate delivery part among the substrate transfer units in accordance with the number of the substrate accommodating units having no substrate in the substrate delivery part, and
wherein the substrate transfer unit is a transfer arm which carries the substrate while the substrate transfer apparatus moves between the substrate storing apparatus and the substrate processing apparatus.

* * * * *

UNITED STATES PATENT AND TRADEMARK OFFICE
CERTIFICATE OF CORRECTION

| | |
|---|---|
| PATENT NO. | : 8,121,723 B2 |
| APPLICATION NO. | : 11/524280 |
| DATED | : February 21, 2012 |
| INVENTOR(S) | : Toshihiko Iijima et al. |

It is certified that error appears in the above-identified patent and that said Letters Patent is hereby corrected as shown below:

Column 8, line 33, change "such has" to --such as--;

Column 16, line 8, change both instances of "PNF" to --PBF--;

Column 17, line 8, change "PNF" to --PBF--;

Column 17, line 45, change "PNF" to --PBF--;

Column 17, line 52, change "PNF" to --PBF--;

Column 17, line 54, change "PNF" to --PBF--; and

Column 17, line 59, change "PNF" to --PBF--.

Signed and Sealed this
Twenty-ninth Day of May, 2012

David J. Kappos
*Director of the United States Patent and Trademark Office*